(12) United States Patent
Dora et al.

(10) Patent No.: US 8,716,141 B2
(45) Date of Patent: May 6, 2014

(54) ELECTRODE CONFIGURATIONS FOR SEMICONDUCTOR DEVICES

(75) Inventors: Yuvaraj Dora, Goleta, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 375 days.

(21) Appl. No.: 13/040,940

(22) Filed: Mar. 4, 2011

(65) Prior Publication Data
US 2012/0223320 A1    Sep. 6, 2012

(51) Int. Cl.
| | |
|---|---|
| *H01L 21/301* | (2006.01) |
| *H01L 21/461* | (2006.01) |
| *H01L 21/4763* | (2006.01) |
| *H01L 21/283* | (2006.01) |
| *H01L 21/285* | (2006.01) |
| *H01L 29/20* | (2006.01) |

(52) U.S. Cl.
CPC ........ *H01L 21/283* (2013.01); *H01L 21/28581* (2013.01); *H01L 29/2003* (2013.01)
USPC ............ 438/704; 438/640; 438/706; 438/675

(58) Field of Classification Search
CPC ... H01L 21/28; H01L 21/283; H01L 21/0254; H01L 21/28581; H01L 21/28264; H01L 29/2003; H01L 29/402
USPC ................ 438/640, 637, 746, 706, 704, 675; 257/E21.159, E21.214
See application file for complete search history.

(56) References Cited

U.S. PATENT DOCUMENTS

| | | | |
|---|---|---|---|
| 4,645,562 | A | 2/1987 | Liao et al. |
| 4,728,826 | A | 3/1988 | Einzinger et al. |
| 4,821,093 | A | 4/1989 | Iafrate et al. |
| 4,914,489 | A | 4/1990 | Awano |
| 5,329,147 | A | 7/1994 | Vo et al. |

(Continued)

FOREIGN PATENT DOCUMENTS

| | | |
|---|---|---|
| CN | 1748320 A | 3/2006 |
| CN | 101107713 A | 1/2008 |

(Continued)

OTHER PUBLICATIONS

Authorized officer Jeongmin Choi, International Search Report and Written Opinion in PCT/US2012/027146, mailed Sep. 24, 2012, 12 pages.

(Continued)

*Primary Examiner* — Shouxiang Hu
(74) *Attorney, Agent, or Firm* — Fish & Richardson P.C.

(57) ABSTRACT

A III-N semiconductor device can include an electrode-defining layer having a thickness on a surface of a III-N material structure. The electrode-defining layer has a recess with a sidewall, the sidewall comprising a plurality of steps. A portion of the recess distal from the III-N material structure has a first width, and a portion of the recess proximal to the III-N material structure has a second width, the first width being larger than the second width. An electrode is in the recess, the electrode including an extending portion over the sidewall of the recess. A portion of the electrode-defining layer is between the extending portion and the III-N material structure. The sidewall forms an effective angle of about 40 degrees or less relative to the surface of the III-N material structure.

19 Claims, 15 Drawing Sheets

(56) References Cited

U.S. PATENT DOCUMENTS

| | | | |
|---|---|---|---|
| 5,618,384 A * | 4/1997 | Chan et al. | 438/597 |
| 5,646,069 A | 7/1997 | Jelloian et al. | |
| 5,663,091 A * | 9/1997 | Yen et al. | 438/600 |
| 5,705,847 A | 1/1998 | Kashiwa et al. | |
| 5,714,393 A | 2/1998 | Wild et al. | |
| 5,998,810 A | 12/1999 | Hatano et al. | |
| 6,008,684 A | 12/1999 | Ker et al. | |
| 6,097,046 A | 8/2000 | Plumton | |
| 6,100,571 A | 8/2000 | Mizuta et al. | |
| 6,316,793 B1 | 11/2001 | Sheppard et al. | |
| 6,373,082 B1 | 4/2002 | Ohno et al. | |
| 6,475,889 B1 | 11/2002 | Ring | |
| 6,486,502 B1 | 11/2002 | Sheppard et al. | |
| 6,515,303 B2 | 2/2003 | Ring | |
| 6,548,333 B2 | 4/2003 | Smith | |
| 6,583,454 B2 | 6/2003 | Sheppard et al. | |
| 6,586,781 B2 | 7/2003 | Wu et al. | |
| 6,649,497 B2 | 11/2003 | Ring | |
| 6,727,531 B1 | 4/2004 | Redwing et al. | |
| 6,777,278 B2 | 8/2004 | Smith | |
| 6,849,882 B2 | 2/2005 | Chavarkar et al. | |
| 6,867,078 B1 | 3/2005 | Green et al. | |
| 6,946,739 B2 | 9/2005 | Ring | |
| 6,979,863 B2 | 12/2005 | Ryu | |
| 6,982,204 B2 | 1/2006 | Saxler et al. | |
| 7,030,428 B2 | 4/2006 | Saxler | |
| 7,045,404 B2 | 5/2006 | Sheppard et al. | |
| 7,071,498 B2 | 7/2006 | Johnson et al. | |
| 7,084,475 B2 | 8/2006 | Shelton et al. | |
| 7,125,786 B2 | 10/2006 | Ring et al. | |
| 7,161,194 B2 | 1/2007 | Parikh et al. | |
| 7,170,111 B2 | 1/2007 | Saxler | |
| 7,230,284 B2 | 6/2007 | Parikh et al. | |
| 7,238,560 B2 | 7/2007 | Sheppard et al. | |
| 7,253,454 B2 | 8/2007 | Saxler | |
| 7,265,399 B2 | 9/2007 | Sriram et al. | |
| 7,268,375 B2 | 9/2007 | Shur et al. | |
| 7,304,331 B2 | 12/2007 | Saito et al. | |
| 7,321,132 B2 | 1/2008 | Robinson et al. | |
| 7,326,971 B2 | 2/2008 | Harris et al. | |
| 7,332,795 B2 | 2/2008 | Smith et al. | |
| 7,364,988 B2 | 4/2008 | Harris et al. | |
| 7,388,236 B2 | 6/2008 | Wu et al. | |
| 7,419,892 B2 | 9/2008 | Sheppard et al. | |
| 7,432,142 B2 | 10/2008 | Saxler et al. | |
| 7,456,443 B2 | 11/2008 | Saxler et al. | |
| 7,465,967 B2 | 12/2008 | Smith et al. | |
| 7,501,669 B2 | 3/2009 | Parikh et al. | |
| 7,544,963 B2 | 6/2009 | Saxler | |
| 7,547,925 B2 | 6/2009 | Wong et al. | |
| 7,548,112 B2 | 6/2009 | Sheppard | |
| 7,550,783 B2 | 6/2009 | Wu et al. | |
| 7,550,784 B2 | 6/2009 | Saxler et al. | |
| 7,566,918 B2 | 7/2009 | Wu et al. | |
| 7,573,078 B2 | 8/2009 | Wu et al. | |
| 7,592,211 B2 | 9/2009 | Sheppard et al. | |
| 7,598,108 B2 | 10/2009 | Li et al. | |
| 7,612,390 B2 | 11/2009 | Saxler et al. | |
| 7,615,774 B2 | 11/2009 | Saxler | |
| 7,638,818 B2 | 12/2009 | Wu et al. | |
| 7,678,628 B2 | 3/2010 | Sheppard et al. | |
| 7,692,263 B2 | 4/2010 | Wu et al. | |
| 7,709,269 B2 | 5/2010 | Smith et al. | |
| 7,709,859 B2 | 5/2010 | Smith et al. | |
| 7,745,851 B2 | 6/2010 | Harris | |
| 7,755,108 B2 | 7/2010 | Kuraguchi | |
| 7,759,700 B2 | 7/2010 | Ueno et al. | |
| 7,777,252 B2 | 8/2010 | Sugimoto et al. | |
| 7,777,254 B2 | 8/2010 | Sato | |
| 7,795,642 B2 | 9/2010 | Suh et al. | |
| 7,812,369 B2 | 10/2010 | Chini et al. | |
| 7,851,825 B2 | 12/2010 | Suh et al. | |
| 7,855,401 B2 | 12/2010 | Sheppard et al. | |
| 7,875,537 B2 | 1/2011 | Suvorov et al. | |
| 7,875,907 B2 | 1/2011 | Honea et al. | |
| 7,875,914 B2 | 1/2011 | Sheppard | |
| 7,884,394 B2 | 2/2011 | Wu et al. | |
| 7,884,395 B2 | 2/2011 | Saito | |
| 7,892,974 B2 | 2/2011 | Ring et al. | |
| 7,893,500 B2 | 2/2011 | Wu et al. | |
| 7,898,004 B2 | 3/2011 | Wu et al. | |
| 7,901,994 B2 | 3/2011 | Saxler et al. | |
| 7,906,799 B2 | 3/2011 | Sheppard et al. | |
| 7,915,643 B2 | 3/2011 | Suh et al. | |
| 7,915,644 B2 | 3/2011 | Wu et al. | |
| 7,919,791 B2 | 4/2011 | Flynn et al. | |
| 7,928,475 B2 | 4/2011 | Parikh et al. | |
| 7,939,391 B2 | 5/2011 | Suh et al. | |
| 7,948,011 B2 | 5/2011 | Rajan et al. | |
| 7,955,918 B2 | 6/2011 | Wu et al. | |
| 7,955,984 B2 * | 6/2011 | Ohki | 438/706 |
| 7,960,756 B2 | 6/2011 | Sheppard et al. | |
| 7,965,126 B2 | 6/2011 | Honea et al. | |
| 7,985,986 B2 | 7/2011 | Heikman et al. | |
| 8,049,252 B2 | 11/2011 | Smith et al. | |
| 8,138,529 B2 | 3/2012 | Wu | |
| 8,193,562 B2 | 6/2012 | Suh et al. | |
| 8,237,198 B2 | 8/2012 | Wu et al. | |
| 8,289,065 B2 | 10/2012 | Honea et al. | |
| 8,344,424 B2 | 1/2013 | Suh et al. | |
| 2001/0032999 A1 | 10/2001 | Yoshida | |
| 2001/0040247 A1 | 11/2001 | Ando et al. | |
| 2002/0036287 A1 | 3/2002 | Yu et al. | |
| 2002/0121648 A1 | 9/2002 | Hsu et al. | |
| 2002/0167023 A1 | 11/2002 | Chavarkar et al. | |
| 2003/0003724 A1 | 1/2003 | Uchiyama et al. | |
| 2003/0006437 A1 | 1/2003 | Mizuta et al. | |
| 2003/0020092 A1 | 1/2003 | Parikh et al. | |
| 2004/0041169 A1 | 3/2004 | Ren et al. | |
| 2004/0061129 A1 | 4/2004 | Saxler et al. | |
| 2004/0164347 A1 | 8/2004 | Zhao et al. | |
| 2005/0077541 A1 | 4/2005 | Shen et al. | |
| 2005/0133816 A1 | 6/2005 | Fan et al. | |
| 2005/0189561 A1 | 9/2005 | Kinzer et al. | |
| 2005/0189562 A1 | 9/2005 | Kinzer et al. | |
| 2005/0194612 A1 | 9/2005 | Beach | |
| 2005/0253168 A1 | 11/2005 | Wu et al. | |
| 2005/0274977 A1 | 12/2005 | Saito et al. | |
| 2006/0011915 A1 | 1/2006 | Saito et al. | |
| 2006/0043499 A1 | 3/2006 | De Cremoux et al. | |
| 2006/0060871 A1 | 3/2006 | Beach | |
| 2006/0076677 A1 * | 4/2006 | Daubenspeck et al. | 257/734 |
| 2006/0102929 A1 | 5/2006 | Okamoto et al. | |
| 2006/0108602 A1 | 5/2006 | Tanimoto | |
| 2006/0108605 A1 | 5/2006 | Yanagihara et al. | |
| 2006/0121682 A1 | 6/2006 | Saxler | |
| 2006/0124962 A1 | 6/2006 | Ueda et al. | |
| 2006/0157729 A1 | 7/2006 | Ueno et al. | |
| 2006/0186422 A1 | 8/2006 | Gaska et al. | |
| 2006/0189109 A1 | 8/2006 | Fitzgerald | |
| 2006/0202272 A1 | 9/2006 | Wu et al. | |
| 2006/0220063 A1 | 10/2006 | Kurachi | |
| 2006/0255364 A1 | 11/2006 | Saxler | |
| 2006/0289901 A1 | 12/2006 | Sheppard et al. | |
| 2007/0007547 A1 | 1/2007 | Beach | |
| 2007/0018187 A1 | 1/2007 | Lee et al. | |
| 2007/0018199 A1 | 1/2007 | Sheppard et al. | |
| 2007/0018210 A1 | 1/2007 | Sheppard | |
| 2007/0045670 A1 | 3/2007 | Kuraguchi | |
| 2007/0080672 A1 | 4/2007 | Yang | |
| 2007/0128743 A1 | 6/2007 | Huang et al. | |
| 2007/0132037 A1 | 6/2007 | Hoshi et al. | |
| 2007/0134834 A1 | 6/2007 | Lee et al. | |
| 2007/0145390 A1 | 6/2007 | Kuraguchi | |
| 2007/0158692 A1 | 7/2007 | Nakayama et al. | |
| 2007/0164315 A1 | 7/2007 | Smith et al. | |
| 2007/0164322 A1 | 7/2007 | Smith et al. | |
| 2007/0194354 A1 | 8/2007 | Wu et al. | |
| 2007/0205433 A1 | 9/2007 | Parikh et al. | |
| 2007/0210329 A1 | 9/2007 | Goto | |
| 2007/0215899 A1 | 9/2007 | Herman | |
| 2007/0224710 A1 | 9/2007 | Palacios et al. | |
| 2007/0228477 A1 | 10/2007 | Suzuki et al. | |
| 2007/0241368 A1 | 10/2007 | Mil'shtein et al. | |

(56) References Cited

U.S. PATENT DOCUMENTS

| | | |
|---|---|---|
| 2007/0278518 A1 | 12/2007 | Chen et al. |
| 2007/0295985 A1 | 12/2007 | Weeks, Jr. et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra et al. |
| 2009/0085065 A1 | 4/2009 | Mishra et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0067275 A1 | 3/2010 | Wang et al. |
| 2010/0140660 A1* | 6/2010 | Wu et al. ............ 257/183 |
| 2010/0201439 A1 | 8/2010 | Wu et al. |
| 2010/0264461 A1 | 10/2010 | Rajan et al. |
| 2011/0006346 A1 | 1/2011 | Ando et al. |
| 2011/0012110 A1 | 1/2011 | Sazawa et al. |
| 2011/0049526 A1 | 3/2011 | Chu et al. |
| 2012/0168822 A1 | 7/2012 | Matsushita |
| 2012/0217512 A1 | 8/2012 | Renaud |

FOREIGN PATENT DOCUMENTS

| | | |
|---|---|---|
| CN | 101312207 A | 11/2008 |
| CN | 101897029 A | 11/2010 |
| CN | 102017160 A | 4/2011 |
| EP | 1 998 376 | 12/2008 |
| EP | 2 188 842 | 5/2010 |
| JP | 11 224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2007-036218 | 2/2007 |
| JP | 2007-215331 | 8/2007 |
| JP | 2008-199771 | 8/2008 |
| JP | 2010-87076 | 4/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| WO | WO 2004/070791 | 8/2004 |
| WO | WO 2004/098060 | 11/2004 |
| WO | WO 2005/059983 | 6/2005 |
| WO | WO 2005/070007 | 8/2005 |
| WO | WO 2005/070009 | 8/2005 |
| WO | WO 2006/114883 | 11/2006 |
| WO | WO 2007077666 | 7/2007 |
| WO | WO 2007/108404 | 9/2007 |
| WO | WO 2008/021544 | 2/2008 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Nora Lindner, International Preliminary Report on Patentability in PCT/US2010/059486, mailed Jun. 21, 2012, 6 pages.

Dora, Y., et al., "High Breakdown Voltage Achieved on AlGaN/GaN HEMTs with Integrated Slant Field Plates," IEEE Electron Device Letters, Sep. 2006, 27(9):713-715.

Authorized officer Keon Hyeong Kim, International Search Report and Written Opinion in PCT/US2008/076160, mailed Mar. 18, 2009, 11 pages.

Authorized officer Simin Baharlou International Preliminary Report on Patentability in PCT/US2008/076160, mailed Mar. 25, 2010, 6 pages.

Authorized officer Sung Hee Kim, International Search Report and Written Opinion in PCT/US2009/057554, mailed May 10, 2010, 13 pages.

Authorized officer Gijsbertus Beijer, International Preliminary Report on Patentability in PCT/US2009/057554, mailed Mar. 29, 2011, 7 pages.

Authorized officer Sung Chan Chung, International Search Report and Written Opinion in PCT/US2010/021824, mailed Aug. 23, 2010, 9 pages.

Authorized officer Beate Giffo-Schmitt, International Preliminary Report on Patentability in PCT/US2010/021824, mailed Aug. 9, 2011, 6 pages.

Authorized officer Chung Keun Lee, International Search Report and Written Opinion in PCT/US2008/076079, mailed Mar. 20, 2009, 11 pages.

Authorized officer Nora Lindner, International Preliminary Report on Patentability in PCT/US2008/076079, mailed Apr. 1, 2010, 6 pages.

Authorized officer Chung Keun Lee, International Search Report and Written Opinion in PCT/US2008/076199, mailed Mar. 24, 2009, 11 pages.

Authorized officer Dorothée Mülhausen, International Preliminary Report on Patentability in PCT/US2008/076199, mailed Mar. 24, 2010, 6 pages.

Authorized officer Chung Keun Lee, International Search Report and Written Opinion in PCT/US2008/076030, mailed Mar. 23, 2009, 10 pages.

Authorized officer Yolaine Cussac, International Preliminary Report on Patentability in PCT/US2008/076030, mailed Mar. 25, 2010, 5 pages.

Authorized officer Keon Kyeong Kim, International Search Report and Written Opinion in PCT/US2008/085031, mailed Jun. 24, 2009, 11 pages.

Authorized officer Yolaine Cussac, International Preliminary Report on Patentability in PCT/US2008/085031, mailed Jun. 24, 2010, 6 pages.

Authorized officer Tae Hoon Kim, International Search Report and Written Opinion in PCT/US2009/041304, mailed Dec. 18, 2009, 13 pages.

Authorized officer Dorothée Mülhausen, International Preliminary Report on Patentability in PCT/US2009/041304, mailed Nov. 4, 2010, 8 pages.

(56) References Cited

OTHER PUBLICATIONS

Authorized officer Cheon Whan Cho, International Search Report and Written Opinion in PCT/US2009/066647, mailed Jul. 1, 2010, 16 pages.
Authorized officer Athina Nickitas-Etienne, International Preliminary Report on Patentability in PCT/US2009/066647, mailed Jun. 23, 2011, 12 pages.
Authorized officer Sang Ho Lee,. International Search Report and Written Opinion in PCT/US2010/059486, mailed Jul. 26, 2011, 9 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 11 pages.
SIPO First Office Action for Application No. 200880120050.6, Aug. 2, 2011, 8 pages.
Planar, Low Switching Loss, Gallium Nitride Devices for Power Conversion Applications, SBIR N121-090 (Navy), 3 pages.
Ando et al., "10-W/mm AlGaN-GaN HFET with a field modulating plate," IEEE Electron Device Letters, May 2003, 24(5):289-291.
Arulkumaran et al., "Surface passivation effects on AlGaN/GaN high-electron-mobility transistors with $SiO_2$, $Si_3N_4$, and silicon oxynitride," Applied Physics Letters, Jan. 26, 2004, 84(4): 613-615.
Chen et al., "High-performance AlGaN/GaN lateral field-effect rectifiers compatible with high electron mobility transistors," 2008, Applied Physics Letters, 92, 253501-1-3.
Chu et al., "1200-V normally off GaN-on-Si field-effect transistors with low dynamic on-resistance," IEEE Electron Device Letters, 2011, 32(5): 632-634.
Coffie, R.L., "Characterizing and suppressing DC-to-RF dispersion in AlGaN/GaN high electron mobility transistors," 2003, PhD Thesis, University of California, Santa Barbara, 169 pages.
Dora, Y., "Understanding material and process limits for high breakdown voltage AlGaN/GaN HEMs," 2006, PhD Thesis, University of California, Santa Barbara, 157 pages.
Dora et al., "$ZrO_2$ gate dielectrics produced by ultraviolet ozone oxidation for GaN and AlGaN/GaN transistors," Mar./Apr. 2006, J. Vac. Sci. Technol. B, 24(2)575-581.
Fanciulli et al., "Structural and electrical properties of $HfO_2$ films grown by atomic layer deposition on Si, Ge, GaAs and GaN," 2004, Mat. Res. Soc. Symp. Proc., 786:E6.14.1-E6.14.6.
Green et al, "The effect of surface passivation on the microwave characteristics of undoped AlGaN/GaN HEMT's," IEEE Electron Device Letters, Jun. 2000, 21(6):268-270.
Gu et al., "AlGaN/GaN MOS transistors using crystalline ZrO2 as gate dielectric," 2007, Proceedings of SPIE, vol. 6473, 64730S, 8 pages.
Higashiwaki et al., "AlGaN/GaN heterostructure field-effect transistors on 4H-SiC Substrates with Current-Gain Cutoff Frequency of 190 GHz," Applied Physics Express, 2008, 1:021103-1-3.
Hwang, J., "Effects of a molecular beam epitaxy grown AlN passivation layer on AlGaN/GaN heterojunction field effect transistors," Solid-State Electronics, 2004, 48:363-366.
Im et al., "Normally off GaN MOSFET based on AlGaN/GaN heterostructure with extremely high 2DEG density grown on silicon substrate," IEEE Electron Device Letters, 2010, 31(3):192-194.
Karmalkar and Mishra, "Very high voltage AlGaN/GaN high electron mobility transistors using a field plate deposited on a stepped insulator," Solid State Electronics, 2001, 45:1645-1652.
Keller et al., "GaN-GaN junctions with ultrathin AlN interlayers: expanding heterojunction design," Applied Physics Letters, 2002, 80(23):4387-4389.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Khan et al, "AlGaN/GaN metal oxide semiconductor heterostructure field effect transistor," IEEE Electron Device Letters, 2000, 21(2):63-65.
Kim, D.H., "Process development and device characteristics of AlGaN/GaN HEMTs for high frequency applications," 2007, PhD Thesis, University of Illinois, Urbana-Champaign, 120 pages.
Kumar et al., "High transconductance enhancement-mode AlGaN/GaN HEMTs on SiC substrate," Electronics Letters, 2003, 39(24):1758-1760.
Kuraguchi et al., "Normally-off GaN-MISFET with well-controlled threshold voltage," Phys. Stats. Sol., 2007, 204(6):2010-2013.
Lanford et al, "Recessed-gate enhancement-mode GaN HEMT with high threshold voltage," 2005, Electronics Letters, vol. 41, No. 7, 2 pages, Online No. 20050161.
Mishra et al., "AlGaN/GaN HEMTs—an overview of device operation and applications," Proceedings of the IEEE, 2002, 90(6):1022-1031.
Mishra et al., "N-face high electron mobility transistors with low buffer leakage and low parasitic resistance," U.S. Appl. No. 60/908,914, filed Mar. 29, 2007, 21 pages.
Mishra et al., "Polarization-induced barriers for n-face nitride-based electronics," U.S. Appl. No. 60/940,052, filed May 24, 2007, 29 pages.
Mishra et al., "Growing N-polar III-nitride Structures," U.S. Appl. No. 60/972,467, filed Sep. 14, 2007, 7 pages.
Nanjo et al., "Remarkable breakdown voltage enhancement in AlGaN channel high electron mobility transistors," Applied Physics Letters, 2008, 92:263502-1-3.
Ota and Nozawa, "AlGaN/GaN recessed MIS-Gate HFET with high threshold-voltage normally-off operation for power electronics applications," IEEE Electron Device Letters, 2008, 29(7):668-670.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Palacios et al., "Nitride-based high electron mobility transistors with a GaN spacer," Applied Physics Letters, 2006, 89:073508-1-3.
Palacios et al., "AlGaN/GaN HEMTs with an InGaN-based back-barrier," Device Research Conference Digest, 200, DRC '05 63rd, Jun. 2005, pp. 181-182.
Palacios et al., "AlGaN/GaN high electron mobility transistors with InGaN back-barriers," IEEE Electron Device Letters, 2006, 27(1):13-15.
Pei et al., "Effect of dielectric thickness on power performance of AlGaN/GaN HEMTs," IEEE Electron Device Letters, 2009, 30:4:313-315-.
Rajan et al, "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Rajan et al., "Advanced transistor structures based on N-face GaN," 32M International Symposium on Compound Semiconductors (ISCS), Sep. 18-22, 2005, Europa-Park Rust, Germany, 2 pages.
Saito et al., "Recessed-gate structure approach toward normally off high-voltage AlGaN/GaN HEMT for power electronics applications," 2006, IEEE Transactions on Electron Device, 53(2):356-362.
Shelton et al., "Selective area growth and characterization of AlGaN/GaN heterojunction bipolar transistors by metalorganic chemical vapor deposition," IEEE Transactions on Electron Devices, 2001, 48(3):490-494.
Shen L., "Advanced polarization-based design of AlGaN/GaN HEMTs," 2004, PhD Thesis, University of California, Santa Barbara, 192 pages.
Sugiura et al., "Enhancement-mode n-channel GaN MOSFETs fabricated on p-GaN using $HfO_2$ as gate oxide," 2007, Electronics Letters, vol. 43, No. 17, 2 pages.
Suh et al, "High breakdown enhancement mode GaN-based HEMTs with integrated slant field plate," U.S. Appl. No. 60/822,886, filed Aug. 18, 2006, 16 pages.

(56) References Cited

OTHER PUBLICATIONS

Suh et al, "III-nitride devices with recessed gates," U.S. Appl. No. 60/972,481, filed Sep. 14, 2007, 18 pages.
Suh, et al. "High-breakdown enhancement-mode AlGaN/GaN HEMTs with integrated slant field-plate," Electron Devices Meeting, 2006, IEDM '06. International (2006), 3 pages.
Tipirneni et al., "Silicon dioxide-encapsulated high-voltage AlGaN/GaN HFETs for power-switching applications," IEEE Electron Device Letters, 28(9):784-786.
Vetury et al., "Direct measurement of gate depletion in high breakdown (405V) Al/GaN/GaN heterostructure field effect transistors," IEDM 98:55-58.
Wang et al., "Comparison of the effect of gate dielectric layer on 2DEG carrier concentration in strained AlGaN/GaN heterostructure," 2005, Mater. Res. Soc. Symp. Proc., 831:E8.20.1-E8.20.6.
Wang, et al., "Enhancement-mode $Si_3N_4$/AlGan/Gan MISHFETs," IEEE Electron Device Letters, 2006, 27(10):793-795.
Wu et al., "A 97.8% efficient GaN HEMT boost converter with 300-W output power at 1 MHz," IEEE Electron Device Letters, 2008, 29(8): 824-826.
Wu, Y., AlGaN/GaN micowave power high-mobility transistors, 1997, PhD Thesis, University of California, Santa Barbara, 134 pages.
Zhang, N., "High voltage GaN HEMTs with low on-resistance for switching applications," 2002, PhD Thesis, University of California, Santa Barbara, 166 pages.
International Preliminary Report on Patentability of International Application No. PCT/US2010/046193, filed Aug. 20, 2013. 10 pages.
International Preliminary Report on Patentability of International Application No. PCT/US2010/059486, filed Dec. 8, 2010. 6 pages.
International Search Report and Written Opinion of the International Searching Authority, International Application Serial No. PCT/US2011/063975, filed Dec. 8, 2011. 8 pages.
International Search Report and Written Opinion of the International Searching Authority, International Application Serial No. PCT/US2011/061407, filed Nov. 18, 2011. 10 pages.
International Search Report and Written Opinion of the International Searching Authority, International Application Serial No. PCT/US2012/023160, filed Jan. 30, 2012. 9 pages.
International Search Report and Written Opinion of the International Searching Authority, International Application Serial No. PCT/US2012/027146, filed Feb. 29, 2012. 12 pages.
SIPO First Office action for Chinese Patent App No. 200980114639.X, dated May 14, 2012. 6 pages.
Search report and action for Taiwan Invention Application No. 098132132, filed Sep. 23, 2009. Dated Dec. 10, 2012. 8 pages.
J. Napierala, H.-J. Bohlmann and M. Ilegems. *Selective GaN Epitaxy on Si(111) Substrates Using Porous Aluminum Oxide Buffer Layers*. Journal of the Electrochemical Society. Volume 153, issue 2. Published 2006. pp. G125-G127.
Zhanghong Content. Two-dimensional electron gas and high electron mobility transistor (HEMT). Shanghai Institute of Metallurgy, Chinese Academy of Sciences . Published Dec. 31, 1984. 17 pages.
Transphorm, Inc. Taiwanese Patent Application No. 101136930, filed Oct. 5, 2012, entitled "High Power Semiconductor Electronic Components With Increased Reliability". English translation of priority U.S. Appl. No. 13/269,367, 58 pages.
Coffie, R., et al., "Unpassivated *p*-GaN/AlGaN/GaN HEMTs with 7.1 W/mm at 10 GhZ," Electronic Letters, 39(19):1419-1420, 2003.
Karmalkar, S. and Mishra U.K., "Enhancement of breakdown voltage in AlGaN/GaN high electron mobility transistors using a field plate," IEEE Transactions on Electron Devices, 48(8):1515-1521, 2001.
Lee, K.P., et al, "Self-aligned process for emitter- and base-regrowth GaN HBTs and BJTs," Solid-State Electronics, 45:243-247, 2001.
Yoshida, S., "AlGan/GaN power FET," Furukawa Review, 21:7-11, 2002.

U.S. Appl. No. 13/019,150, filed Feb. 1, 2011, Enhancement Mode Gallium Nitride Power Devices.
U.S. Appl. No. 12/209,581, filed Sep. 12, 2008, III-Nitride Bidirectional Switches.
U.S. Appl. No. 60/972,467, filed Sep. 14, 1007, Growing N-Polar III-Nitride Structures.
U.S. Appl. No. 12/324,574, filed Nov. 26, 2008, Insulated Gate E-Mode Transistors.
U.S. Appl. No. 13/164,109, filed Jun. 20, 2011, Bridge Circuits and Their Components.
U.S. Appl. No. 12/556,438, filed Sep. 9, 2009, Inductive Load Power Switching Circuits.
U.S. Appl. No. 13/008,874, filed Jan. 18, 2011, Semiconductor Heterostructure Diodes.
U.S. Appl. No. 12/611,018, filed Nov. 2, 2009, Package Configurations for Low EMI Circuits.
U.S. Appl. No. 12/953,769, filed Nov. 24, 2010, Layer Structures for Controlling Stress of Heteroepitaxially Grown III-Nitride.
U.S. Appl. No. 13/040,940, filed Mar. 4, 2011, Electrode Configurations for Semiconductor Devices.
U.S. Appl. No. 13/406,723, filed Feb. 28, 2012, Enhancement Mode Gallium Nitride Power Devices.
Authorized officer Athina Nickitas-Etienne, International Preliminary Report on Patentability in PCT/US2012/027146, mailed Sep. 19, 2013, 9 pages.
U.S. Appl. No. 11/856,695, filed Sep. 17, 2007, Gallium Nitride Diodes and Integrated Components.
U.S. Appl. No. 13/723,753, filed Dec. 21, 2012, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 60/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/164,109, fild Jun. 20, 2011, Bridge Circuits and their Components.
U.S. Appl. No. 12/108,449, filed Apr. 23, 2008, Enhancement Mode III-N HEMPTs.
U.S. Appl. No. 61/099,451, filed Sep. 23, 2008, Inductive Load Power Switching Circuits.
U.S. Appl. No. 13/618,502, filed Sep. 14, 2012, Inductive Load Power Switching Circuits.
U.S. Appl. No. 13/618,726, filed Sep. 14, 2012, Inductive Load Power Switching Circuits.
U.S. Appl. No. 13/533,339, filed Jun. 26, 2012, Semiconductor Heterostructure Diodes.
U.S. Appl. No. 13/355,885, filed Jan. 23, 2012, Package Configurations for Low EMI Circuits.
U.S. Appl. No. 12/635,405, filed Dec. 10, 2009, Reverse Side Engineered III-Nitride Devices.
U.S. Appl. No. 12/465,968, filed May 14, 2009, High Voltage III-Nitride Semiconductor Devices.
U.S. Appl. No. 12/550,140, filed Aug. 28, 2009, Semiconductor Devices with Field Plates.
U.S. Appl. No. 13/748,907, filed Jan. 24, 2013, Semiconductor Devices with Field Plates.
U.S. Appl. No. 12/684,838, filed Jan. 8, 2010, Electronic Devices and Components for High Efficiency Power Circuits.
U.S. Appl. No. 12/701,458, filed Feb. 5, 2010, Semiconductor Electronic Components and Circuits.
U.S. Appl. No. 12/968,704, filed Dec. 15, 2010, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.

(56) References Cited

OTHER PUBLICATIONS

U.S. Appl. No. 13/019,733, filed Feb. 2, 2011, III-N Device Structures and Methods.
U.S. Appl. No. 13/040,524, filed Mar. 4, 2011, Semiconductor Diodes with Low Reverse Bias Currents.
U.S. Appl. No. 61/447,519, filed Feb. 28, 2011, Electronic Components with Reactive Filters.
U.S. Appl. No. 13/403,813, filed Feb. 23, 2012, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 13/405,041, filed Feb. 24, 2012, Semiconductor Power Modules and Devices.
U.S. Appl. No. 61/621,956, filed Apr. 9, 2012, N-Polar III-Nitride Transistors.
U.S. Appl. No. 13/231,308, filed Sep. 13, 2011, III-N Device Structures Having a Non-Insulating Substrate.
U.S. Appl. No. 13/269,367, filed Oct. 7, 2011, High Power Semiconductor Electronic Components with Increased Reliability.
U.S. Appl. No. 13/535,094, filed Jun. 27, 2012, Semiconductor Devices with Integrated Hole Collectors.
U.S. Appl. No. 13/550,445, filed Jul. 16, 2012, Semiconductor Electronic Components with Integrated Current Limiters.
U.S. Appl. No. 13/551,094, Jul. 17, 2012, Contacts for Semiconductor Devices and Methods of Forming the Same.
U.S. Appl. No. 61/672,723, filed Jul. 17, 2012, Devices and Components for Power Conversion Circuits.

\* cited by examiner

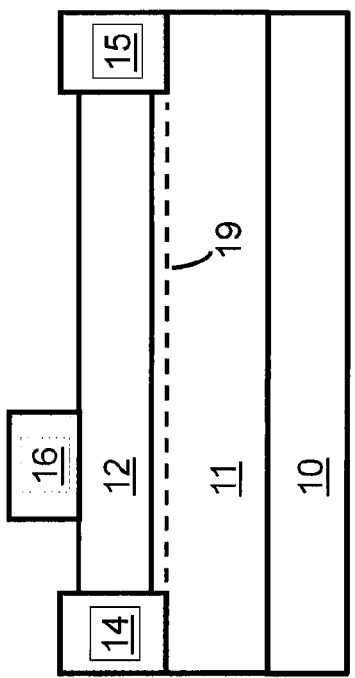
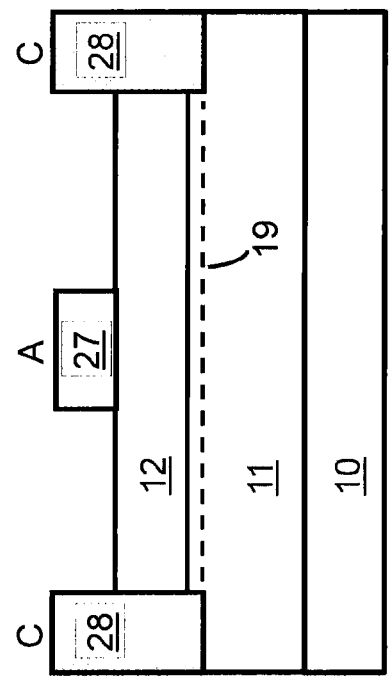

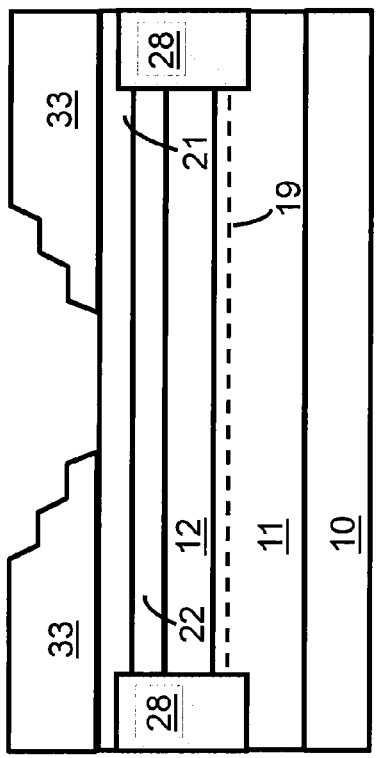
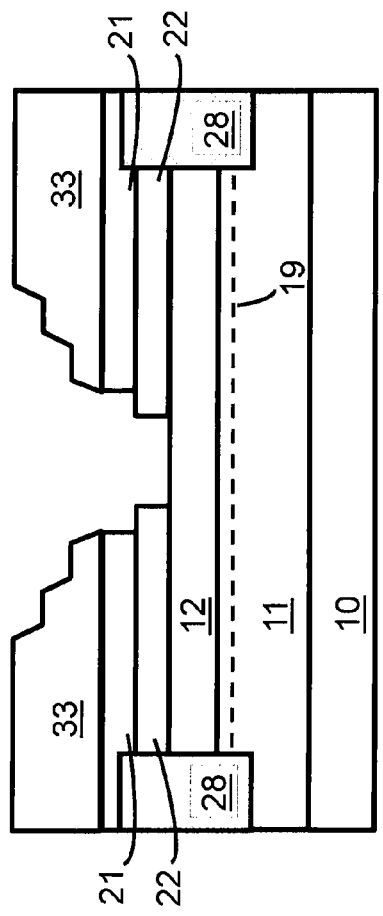

ELECTRODE CONFIGURATIONS FOR SEMICONDUCTOR DEVICES

TECHNICAL FIELD

This invention relates to semiconductor electronic devices, specifically devices with electrodes connected to field plates.

BACKGROUND

To date, modern power semiconductor diodes such as high-voltage P-I-N diodes, as well as power transistors such as power MOSFETs and Insulated Gate Bipolar Transistors (IGBT), have been typically fabricated with silicon (Si) semiconductor materials. More recently, silicon carbide (SiC) power devices have been researched due to their superior properties. III-Nitride (III-N) semiconductor devices are now emerging as an attractive candidate to carry large currents and support high voltages, and provide very low on resistance, high voltage device operation, and fast switching times. As used herein, the terms III-N or III-Nitride materials, layers, devices, etc., refer to a material or device comprised of a compound semiconductor material according to the stoichiometric formula $Al_xIn_yGa_zN$, where x+y+z is about 1.

Examples of III-N high electron mobility transistors (HEMTs) and III-N diodes, respectively, of the prior art are shown in FIGS. 1 and 2. The III-N HEMT of FIG. 1 includes a substrate 10, a III-N channel layer 11, such as a layer of GaN, atop the substrate, and a III-N barrier layer 12, such as a layer of $Al_xGa_{1-x}N$, atop the channel layer. A two-dimensional electron gas (2DEG) channel 19 is induced in the channel layer 11 near the interface between the channel layer 11 and the barrier layer 12. Source and drain contacts 14 and 15, respectively, form ohmic contacts to the 2DEG channel. Gate contact 16 modulates the portion of the 2DEG in the gate region, i.e., directly beneath gate contact 16. The III-N diode of FIG. 2 includes similar III-N material layers to those of the III-N HEMT of FIG. 1. However, the III-N diode of FIG. 2 only includes two contacts, an anode contact 27 and a cathode contact 28. The anode contact 27 is formed on the III-N barrier layer 12, and the cathode contact 28 is a single contact which contacts the 2DEG 19. The anode contact 27 is a Schottky contact, and the single cathode contact 28 is an ohmic contact. In FIG. 2, while there appears to be two cathode contacts, the two contacts are in fact electrically connected so as to form a single cathode contact 28.

Field plates are commonly used in III-N devices to shape the electric field in the high-field region of the device in such a way that reduces the peak electric field and increases the device breakdown voltage, thereby allowing for higher voltage operation. An example of a field plated III-N HEMT of the prior art is shown in FIG. 3. In addition to the layers included in the device of FIG. 1, the device in FIG. 3 includes a field plate 18 which is connected to gate 16, and an insulator layer 13, such as a layer of SiN, is between the field plate and the III-N barrier layer 12. Field plate 18 can include or be formed of the same material as gate 16. Insulator layer 13 can act as a surface passivation layer, preventing or suppressing voltage fluctuations at the surface of the III-N material adjacent to insulator layer 13.

Slant field plates have been shown to be particularly effective in reducing the peak electric field and increasing the breakdown voltage in III-N devices. A prior art III-N device similar to that of FIG. 3, but with a slant field plate 24, is shown in FIG. 4. In this device, gate 16 and slant field plate 24 are formed of a single electrode 29. Insulator layer 23, which can be SiN, is an electrode-defining layer that contains a recess which defines at least in part the shape of electrode 29. Electrode-defining layer 23 can also act as a surface passivation layer, preventing or suppressing voltage fluctuations at the surface of the III-N material adjacent to electrode-defining layer 23. The gate 16 and slant field plate 24 in this device can be formed by first depositing electrode-defining layer 23 over the entire surface of III-N barrier layer 12, then etching a recess through the electrode-defining layer 23 in the region containing gate 16, the recess including a slanted sidewall 25, and finally depositing electrode 29 at least in the recess and over the slanted sidewall 25. Similar slant field plate structures can be formed in III-N diodes. For example, a III-N diode similar to that of FIG. 2 can also include a slant field plate connected to the anode contact 27.

Slant field plates, such as field plate 24 in FIG. 4, tend to spread the electric fields in the device over a larger volume as compared to conventional field plates, such as field plate 18 in FIG. 3, which do not include a slanted portion. Hence, slant field plates tend to be more effective at reducing the peak electric field in the underlying device, thereby allowing for larger operating and breakdown voltages.

While slant field plates are desirable for many applications, they can be difficult to fabricate reproducibly. Field plate structures that can provide adequate suppression of peak electric fields and can be fabricated reproducibly are therefore desirable.

SUMMARY

In one aspect, a III-N semiconductor device is described that includes an electrode-defining layer having a thickness on a surface of a III-N material structure. The electrode-defining layer has a recess with a sidewall, the sidewall comprising a plurality of steps. A portion of the recess distal from the III-N material structure has a first width, and a portion of the recess proximal to the III-N material structure has a second width, the first width being larger than the second width. An electrode is in the recess, the electrode including an extending portion over the sidewall of the recess. A portion of the electrode-defining layer is between the extending portion and the III-N material structure. The sidewall forms an effective angle of about 40 degrees or less relative to the surface of the III-N material structure.

In another aspect, a III-N semiconductor device is described that includes an electrode-defining layer having a thickness on a surface of a III-N material structure. The electrode-defining layer has a recess with a sidewall, the sidewall comprising a plurality of steps. A portion of the recess distal from the III-N material structure has a first width, and a portion of the recess proximal to the III-N material structure has a second width, the first width being larger than the second width. An electrode is in the recess, the electrode including an extending portion over the sidewall of the recess. A portion of the electrode-defining layer is between the extending portion and the III-N material structure. At least one of the steps in the sidewall has a first surface that is substantially parallel to the surface of the III-N material structure and a second surface that is slanted, the second surface forming an angle of between 5 and 85 degrees with the surface of the III-N material structure.

Devices described herein may include one or more of the following features. The III-N material structure can include a first III-N material layer, a second III-N material layer, and a 2DEG channel induced in the first III-N material layer adjacent to the second III-N material layer as a result of a compositional difference between the first III-N material layer and the second III-N material layer. The first III-N material layer can include GaN. The second III-N material layer can include AlGaN or AlInGaN. A third III-N material layer can be included between the first III-N material layer and the second III-N material layer. The third III-N material layer can include AlN. The first III-N material layer and the second III-N material layer can be group III-face or [0 0 0 1] oriented or group-III terminated semipolar layers, and the second III-N material layer can be between the first III-N material layer and the electrode-defining layer. The first III-N material layer and the second III-N material layer can be N-face or [0 0 0 1 bar] oriented or nitrogen-terminated semipolar layers, and the first III-N material layer can be between the second III-N material layer and the electrode-defining layer.

The recess can extend through the entire thickness of the electrode-defining layer, or into the III-N material structure, or through the 2DEG channel. The recess can extend at least 30 nanometers into the III-N material structure. The recess can extend partially through the thickness of the electrode-defining layer. The electrode-defining layer can have a composition that is substantially uniform throughout. The electrode-defining layer can include $SiN_x$. A thickness of the electrode-defining layer can be between about 0.1 microns and 5 microns.

A dielectric passivation layer can be included between the III-N material structure and the electrode-defining layer, the dielectric passivation layer directly contacting a surface of the III-N material adjacent to the electrode. The dielectric passivation layer can include $SiN_x$. The dielectric passivation layer can be between the electrode and the III-N material structure, such that the electrode does not directly contact the III-N material structure. An additional insulating layer can be included between the dielectric passivation layer and the electrode-defining layer. The additional insulating layer can include AlN. The additional insulating layer can be less than about 20 nanometers thick.

The extending portion of the electrode can function as a field plate. The electrode can be an anode, and the device can be a diode. The electrode can be a gate, and the device can be a transistor. The device can be an enhancement-mode device, or a depletion-mode device, or a high-voltage device. The effective angle can be about 20 degrees or less, and a breakdown voltage of the device can be about 100V or larger. The effective angle can be about 10 degrees or less, and a breakdown voltage of the device can be about 300V or larger.

At least one of the steps can have a first surface that is substantially parallel to the surface of the III-N material structure and a second surface that is substantially perpendicular to the surface of the III-N material structure. At least one of the steps can have a first surface that is substantially parallel to the surface of the III-N material structure and a second surface that is slanted, the second surface forming an angle of between 5 and 85 degrees with the surface of the III-N material structure. The extending portion can directly contact the sidewall.

In another aspect, a method of forming a III-N device is described that includes forming an electrode-defining layer having a thickness on a surface of a III-N material structure, and patterning a masking layer over the electrode-defining layer, the masking layer including an opening having a width. The method also includes etching the electrode-defining layer to form a recess therein, the recess having a sidewall which comprises a plurality of steps. A portion of the recess distal from the III-N material structure has a first width, and a portion of the recess proximal to the III-N material structure has a second width, the first width being larger than the second width. The method further includes removing the masking layer, and forming an electrode in the recess, the electrode including an extending portion over the sidewall. A portion of the electrode-defining layer is between the extending portion and the III-N material structure. The etching step includes a first procedure and a second procedure, the first procedure comprising removing a portion of the electrode-defining layer, and the second procedure comprising removing a portion of the masking layer without entirely removing the masking layer. The second procedure causes an increase in the width of the opening in the masking layer.

Methods described herein can include one or more of the following. The first procedure can be performed a second time after the second procedure has been performed. The second procedure can be performed a second time after the first procedure has been performed a second time. The masking layer can include photoresist, and the photoresist in the masking layer can be redistributed prior to performing the etching step. Redistributing the photoresist can include thermally annealing the photoresist. Redistributing the photoresist can cause the masking layer to have slanted sidewalls adjacent to the opening. The etching step can result in the recess extending through the entire thickness of the electrode-defining layer. The etching step can be a first etching step, and the method can further comprise a second etching step resulting in the recess further extending into the III-N material structure.

The device can further comprise an additional dielectric layer having a thickness between the electrode-defining layer and the III-N material structure. The etching step can result in the recess further extending through the entire thickness of the additional dielectric layer. The electrode can be an anode, and the III-N device can be a diode. The electrode can be a gate, and the III-N device can be a transistor. The etching step can result in the sidewall forming an effective angle of about 40 degrees or less relative to the surface of the III-N material structure. The etching step can result in at least one of the steps in the sidewall having a first surface that is substantially parallel to the surface of the III-N material structure and a second surface that is slanted, the second surface forming an angle of between 5 and 85 degrees with the surface of the III-N material structure.

III-N devices which can be fabricated reproducibly, can support high voltages with low leakage, and at the same time can exhibit low on-resistance and high breakdown voltage, are described. Methods of forming the devices are also described. The III-N devices described herein can be transistors or diodes, and can be high-voltage devices suitable for high voltage applications. The details of one or more implementations of the invention are set forth in the accompanying drawings and description below. Other features and advantages of the invention will be apparent from the description and drawings, and from the claims.

DESCRIPTION OF DRAWINGS

FIG. 1 is a cross-sectional view of a III-N HEMT device of the prior art.

FIG. 2 is a cross-sectional view of a III-N diode of the prior art.

FIGS. 11-20 illustrate a method of forming the III-N diode of FIG. 5.

Like reference symbols in the various drawings indicate like elements.

DETAILED DESCRIPTION

Devices based on III-N heterostructures are described. An electrode of the device is designed such that the device can be fabricated reproducibly, can support high voltages with low leakage, and at the same time can exhibit low on-resistance. Methods of forming the devices are also described. The III-N devices described herein can, for example, be transistors or diodes, and can be high-voltage devices suitable for high voltage applications. In such a high-voltage diode, when the diode is reverse biased, the diode is at least capable of supporting all voltages less than or equal to the high-voltage in the application in which it is used, which for example may be 100V, 300V, 600V, 1200V, 1700V, or higher. When the diode is forward biased, it is able to conduct substantial current with a low on-voltage. The maximum allowable on-voltage is the maximum voltage that can be sustained in the application in which the diode is used. When a high voltage transistor is biased off (i.e., the voltage on the gate relative to the source is less than the transistor threshold voltage), it is at least capable of supporting all source-drain voltages less than or equal to the high-voltage in the application in which it is used. When the high voltage transistor is biased on (i.e., the voltage on the gate relative to the source is greater than the transistor threshold voltage), it is able to conduct substantial current with a low on-voltage. The maximum allowable on-voltage is the maximum voltage that can be sustained in the application in which the transistor is used.

Figure 4:
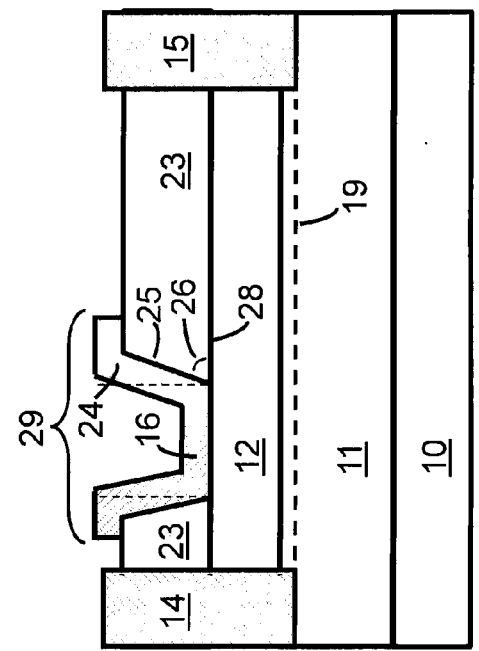

Referring to FIG. 4, for a given thickness of the electrode-defining layer 23, the horizontal length of the region which the electric field is spread over, resulting from inclusion of the slant field plate 24, is largely determined by the angle 26 which the field plate forms with the surface 28 of the underlying III-N material structure. A smaller angle 26 results in a greater spreading of the electric fields, allowing for correspondingly larger operating and breakdown voltages of the device. For example, in a III-N device with an electrode-defining layer 23 which is about 0.85 microns thick, an angle of about 40 degrees or less may be required for reliable 50V or 100V operation, whereas an angle of about 10 degrees or less may be required for reliable 300V or 600V operation. However, it can be difficult to reproducibly fabricate slant field plates 24 with such small angles 26. A field plate structure which allows for comparable device operating and breakdown voltages but which can be fabricated reproducibly is necessary for large scale manufacturing.

As illustrated in FIGS. 5-10, the III-N devices described herein are transistors and diodes that each include an electrode-defining layer on top of a III-N material structure. The electrode-defining layer includes a recess, and an electrode is in the recess. The width at the top of the recess is greater than the width at the bottom of the recess. The electrode includes an extending portion which is over a portion of the electrode-defining layer and functions as a field plate. The electrode is deposited conformally in the recess in the electrode-defining region with the extending portion over a sidewall of the recess. Hence, the profile of the extending portion is at least partially determined by the profile of the sidewall. The sidewall of the recess underneath the extending portion of the electrode includes a plurality of steps. The sidewall forms an effective angle relative to the uppermost surface of the underlying III-N material structure. The effective angle can be small enough to allow for high voltage operation of the device, as required by the circuit application in which the device is used.

Figure 5:
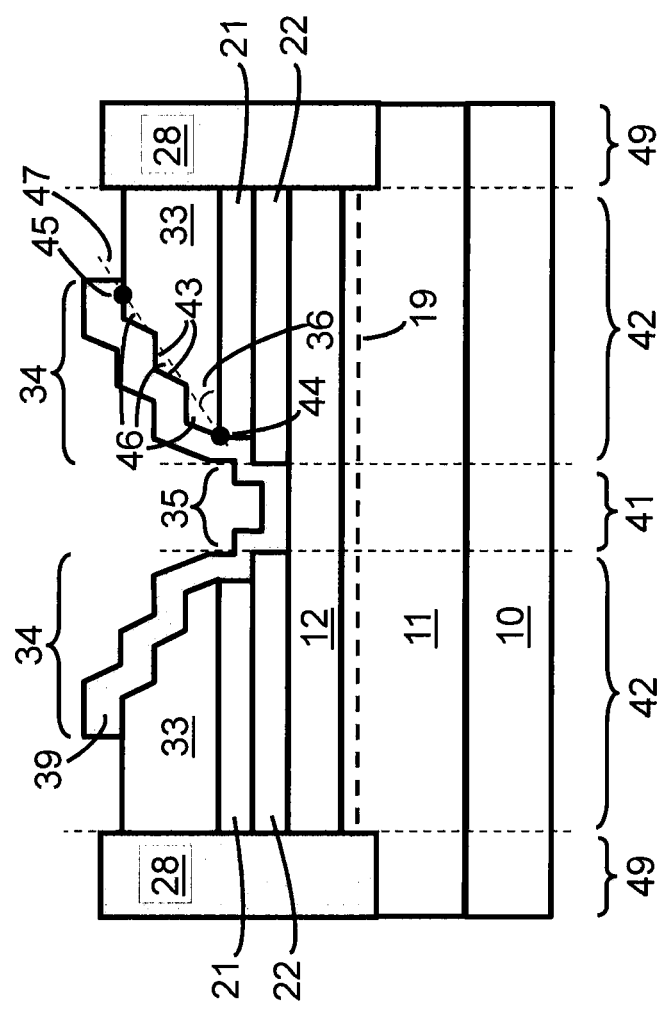
FIG. 5 is a cross-sectional view of one implementation of a III-N diode.

Referring to FIG. 5, a III-N diode includes a substrate 10, a first III-N layer 11 on top of the substrate, and a second III-N layer 12 on top of the first III-N layer. III-N layers 11 and 12 have different compositions from one another, the compositions selected such that a two-dimensional electron gas (2DEG) 19 (illustrated by a dashed line), i.e., a conductive channel, is induced in the first III-N layer 11 near the interface between the first and second III-N layers 11 and 12, respectively.

An electrode-defining layer 33 is formed over the second III-N layer 12, the electrode-defining layer 33 including a recess in which anode contact 39 is subsequently formed, extending through the entire thickness of the electrode-defining layer 33. The electrode-defining layer is typically between about 0.1 microns and 5 microns thick, such as about 0.85 microns thick. The electrode-defining layer 33 can have a composition that is substantially uniform throughout. The electrode-defining layer 33 is formed of an insulator, such as $SiN_x$. An anode contact 39 formed in the recess contacts the upper surface of the second III-N layer 12 in region 41 of the device. The anode contact 39 includes an extending portion 34, lying over a portion of the electrode-defining layer 33, that functions as a field plate. The anode contact 39 is deposited conformally in the recess in the electrode-defining layer 33 with the extending portion 34 over a sidewall 43 of the recess, the sidewall 43 extending from the portion of the electrode-defining layer 33 which is closest to region 41 (i.e., point 44) all the way to the point 45 at the top of the electrode-defining layer 33 just beyond where the electrode-defining layer 33 becomes substantially flat. Hence, the profile of the extending portion is at least partially determined by the profile of the sidewall 43. A single cathode contact 28 is formed which contacts the 2DEG 19 and is in close proximity to at least a portion of anode contact 39. The anode contact 39 is a Schottky contact, and the single cathode contact 28 is an ohmic contact.

As used herein, the term "single cathode contact" refers to either a single metallic contact which serves as a cathode, or to a plurality of contacts serving as cathodes which are electrically connected such that the electric potential at each contact is about the same, or is intended to be the same, during device operation. In the cross-sectional view of FIG. 5, while there appear to be two cathode contacts, the two contacts are in fact electrically connected so as to form a single cathode contact 28. This is shown more clearly in FIG. 6, which is a plan view diagram of the diode of FIG. 5. As used herein, two or more contacts or other elements are said to be "electrically connected" if they are connected by a material which is sufficiently conducting to ensure that the electric potential at each of the contacts or other elements is about the same, or is intended to be the same, at all times during operation.

Figure 6:
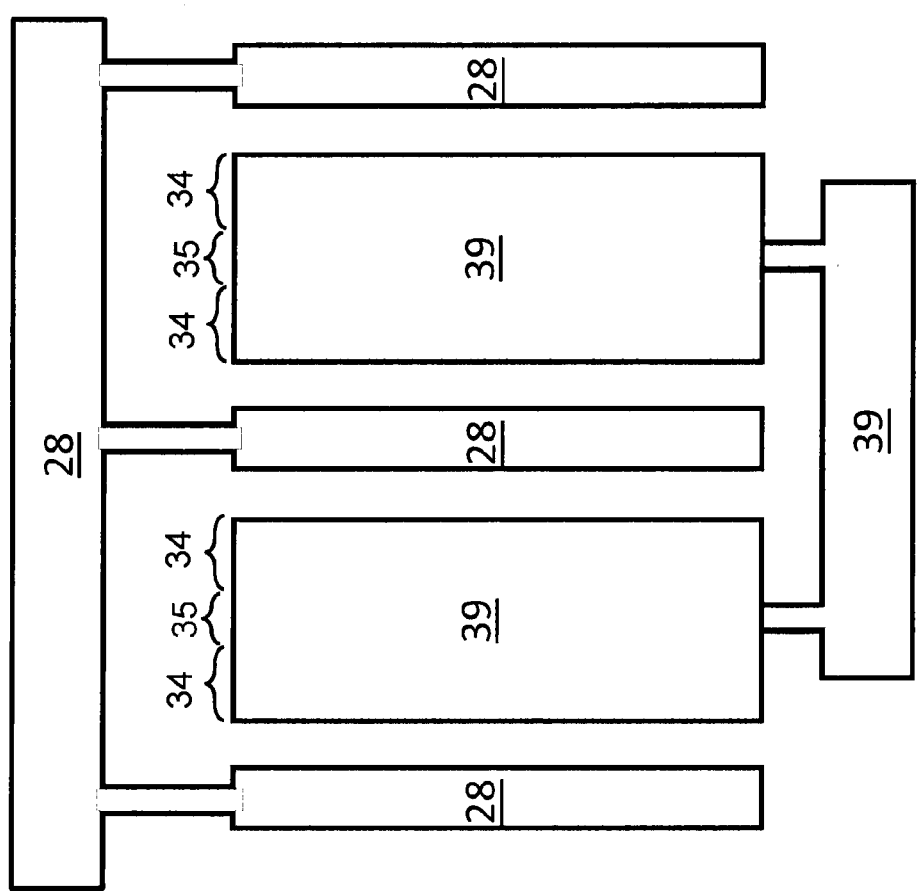
FIG. 6 is a plan view of the electrode layout of a III-N diode.

FIG. 6 is a plan view (top view) of an electrode configuration that may be used in the device of FIG. 5, and includes alternating "fingers" of cathode contact 28 and anode contact 39, connected to cathode and anode contact pads shown on the top and bottom, respectively, of FIG. 6. While the cross-sectional view of FIG. 5 only illustrates a single anode finger and two cathode fingers, additional cathode and anode fingers can be added, as shown in FIG. 6.

Referring back to FIG. 5, the diode may also optionally include a passivation layer 22 which contacts the III-N material surface at least between the anode and cathode contacts 39 and 28, respectively, and an additional dielectric layer 21 between the passivation layer 22 and the electrode-defining layer 33. The device may also include additional III-N layers (not shown), for example a III-N buffer layer between the first III-N layer 11 and the substrate 10, or a III-N layer such as AlN between the first III-N layer 11 and the second III-N layer 12.

The diode in FIG. 5 operates as follows. When the voltage at the anode contact 39 is less than that at the cathode contact 28, such that the Schottky junction between anode contact 39 and III-N layer 12 is reverse biased, the diode is in the OFF state with only a small reverse bias current flowing between the anode and cathode. Ideally, the reverse bias current is as small as possible. When the voltage at the anode contact 39 is greater than that at the cathode contact 28, the Schottky junction between anode contact 39 and III-N layer 12 is forward biased, and the diode is in the ON state. In this state, a substantial electron current flows from the cathode contact 28 predominantly through the 2DEG 19 and then through the forward biased Schottky junction into the anode contact 39. At least 99% of the total forward bias current flows from the anode to the cathode through the Schottky barrier and through the 2DEG channel. A small amount of leakage current can flow through other paths, such as along the surface of the device.

As stated earlier, III-N layers 11 and 12 have different compositions from one another. The compositions are selected such that the second III-N layer 12 has a larger bandgap than the first III-N layer 11, which helps enable the formation of 2DEG 19. If III-N layers 11 and 12 are composed of III-N material oriented in a non-polar or semi-polar orientation, then doping all or part of the second semiconductor layer 12 with an n-type impurity may also be required to induce the 2DEG 19. If the III-N layers 11 and 12 are oriented in a polar direction, such as the [0 0 0 1] (i.e., group III-face) orientation, then 2DEG 19 may be induced by the polarization fields without the need for any substantial doping of either of the III-N layers, although the 2DEG sheet charge concentration can be increased by doping all or part of the second III-N layer 12 with an n-type impurity. Increased 2DEG sheet charge concentrations can be beneficial in that they can reduce the diode on-resistance, but they can also lead to lower reverse breakdown voltages. Hence the 2DEG sheet charge concentration preferably is optimized to a suitable value for the application in which the diode is used.

Figure 3:
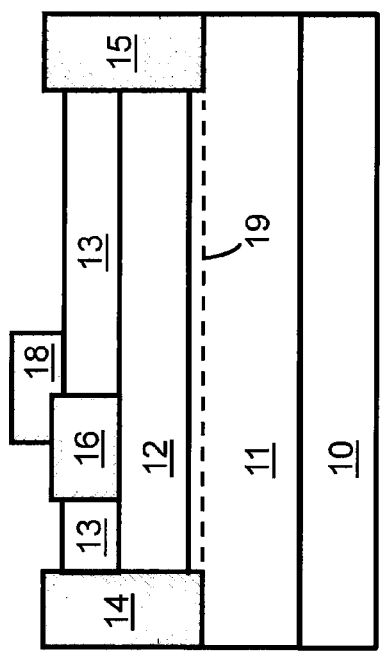
FIGS. 3-4 are cross-sectional views of III-N HEMT devices of the prior art.

III-N materials can be used for layers 11 and 12, the compositions of these layers being chosen such that the requirements for layers 11 and 12 are satisfied. As an example, III-N layer 11 can be GaN and III-N layer 12 can be AlGaN or AlInGaN, whereas layer 12 can be n-doped or can contain no significant concentration of doping impurities. In the case that layer 12 is undoped, the induced 2DEG results from the difference in polarization fields between layers 11 and 12. The III-N material configurations for the diode described above can also be used in a III-N HEMT device, as seen, for example, in FIGS. 1, 3, and 4. Hence, the diodes described herein can be integrated with III-N HEMT devices onto a single chip, thereby simplifying the fabrication process and reducing cost of circuits that require both diodes and HEMTs.

Substrate 10 can be any suitable substrate upon which III-N layers 11 and 12 can be formed, for example silicon carbide (SiC), silicon, sapphire, GaN, AlN, or any other suitable substrate upon which III-N devices can be formed. In some implementations, a III-N buffer layer (not shown) such as AlGaN or AlN is included between substrate 10 and semiconductor layer 11 to minimize material defects in layers 11 and 12.

The diode of FIG. 5 optionally includes a passivation layer 22 and an additional dielectric layer 21. Passivation layer 22, formed of an insulating dielectric material, such as $SiN_x$, atop the second III-N layer 12, maintains effective passivation of the uppermost III-N surface of the device. As used herein, a "passivation layer" refers to any layer or combination of layers grown or deposited on a surface of a semiconductor layer in a semiconductor device which can prevent or suppress voltage fluctuations at the surface during device operation, thereby preventing or suppressing dispersion. For example, a passivation layer may prevent or suppress the formation of surface/interface states at the uppermost III-N surface, or it may prevent or suppress the ability of surface/interface states to trap charge during device operation. Additional dielectric layer 21, which is optionally included between passivation layer 22 and electrode-defining layer 33, can simplify device fabrication by serving as an etch stop layer. Additional dielectric layer 21 can be formed of a material for which an etch chemistry exists that can etch the material of electrode-defining layer 33 but will not substantially etch the material of additional dielectric layer 21. Additionally, because the anode contact 39 is in contact with the underlying III-N materials, the recess in the electrode-defining layer 33 also extends entirely through the additional dielectric layer 21 and the passivation layer 22. In some implementations, passivation layer 22 and the additional dielectric layer 21 are omitted, and electrode-defining layer 33 maintains effective passivation of the uppermost III-N surface of the device.

Dispersion refers to a difference in observed current-voltage (I-V) characteristics when the device is operated under RF or switching conditions, as compared to when the device is operated under DC conditions. In III-N devices, effects such as dispersion are often caused by voltage fluctuations at uppermost III-N surfaces, the result of charging of the surface states during device operation. Accordingly, a passivation layer such as layer 22 prevents or suppresses dispersion by preventing or suppressing voltage fluctuations at the uppermost III-N surface.

Referring to the diode of FIG. 5, when passivation layer 22 is included, electrode-defining layer 33 in combination with passivation layer 22 maintains effective passivation of the uppermost III-N surface of the device. When an additional dielectric layer 21, such as AlN is included between the passivation layer 22 and electrode-defining layer 33, the additional dielectric layer 21 may need to be made thin enough, such as thinner than about 20 nm, thinner than about 10 nm, or thinner than about 5 nm, to ensure that effective passivation of the uppermost III-N surface is still maintained. Too thick an additional dielectric layer 21, such as greater than about 20 nm, can degrade the passivation effects of layers 22 and 33.

The portion 35 of anode contact 39 that is formed upon the surface of III-N layer 12 forms a Schottky contact to layer 12. Cathode contact 28 contacts the 2DEG 19 in ohmic region 49, forming a substantially ohmic contact. Cathode contact 28 can contact the 2DEG 19 in a number of ways. For example, a metal or combination of metals can be deposited in ohmic contact region 49 upon the surface of layer 12, followed by a thermal anneal which results in the deposited metal forming a metallic alloy with the underlying semiconductor material. Other methods by which the 2DEG can be contacted include, but are not limited to, ion implantation of n-type dopants into ohmic region 49, followed by a metal deposition atop this region, or by etching away the material in ohmic contact region 49 and regrowing n-type material, followed by a metal deposition atop this region. Anode contact 39 and cathode contact 28 may be any arbitrary shape, although the shape is ideally optimized to minimize the device area required for a given forward current.

The sidewall 43 (and hence also the extending portion 34 of the anode contact 39) includes a plurality of steps 46. FIG. 5 illustrates the case where three steps 46 are included. The horizontal width of the uppermost step is defined to be the average width of the other steps in the structure. Hence, the end of the sidewall 43 closest to the cathode contact 28 (i.e., the position of point 45) is defined to be at the end of the uppermost step. The sidewall 43 has an effective slope, which is equal to the slope of the dashed line 47 which passes through point 44 to point 45. As such, the sidewall 43 forms an effective angle 36 with the uppermost surface of the underlying III-N material structure.

For a given thickness of the electrode-defining layer 33, a smaller effective angle 36 tends to correspond to a smaller peak electric field in the underlying device. Hence, a smaller effective angle 36 tends to result in a device with a larger breakdown voltage and improved reliability at higher operating voltages. For example, a device designed to operate at a reverse bias of about 50V or 100V may require an effective angle 36 which is about 40 degrees or smaller. A device designed to operate at a reverse bias of about 200V may require an effective angle 36 which is about 20 degrees or smaller, and a device designed to operate at a reverse bias of about 300V or 600V may require an effective angle 36 which is about 10 degrees or smaller. While slant field plate structures with angles which are about 40 degrees or smaller tend to be difficult to manufacture reproducibly, especially as the electrode-defining layer 33 is made thicker, stepped field plate structures, such as those shown in FIG. 5, can be much more easily manufactured reproducibly with effective angles which are about 40 degrees or smaller.

As seen in FIG. 5, each of the steps 46 includes two surfaces (although the steps could each include additional surfaces). A first surface of the step 46 is substantially parallel to the uppermost surface of the III-N material structure, while a second surface is at an angle relative to the uppermost surface of the III-N material structure. The second surface of the step 46 can be substantially perpendicular to the uppermost surface of the III-N material structure, or the second surface can be slanted, for example forming an angle between about 5 degrees and 85 degrees with the uppermost surface of the III-N material structure. While it may be simpler to manufacture a step 46 where the second surface is substantially perpendicular to the uppermost surface of the III-N material structure, making the second surface slanted may be preferable, as this can further reduce the peak electric field in the underlying device, as well as allowing for a smaller effective angle 36 of the sidewall 43 relative to the uppermost surface of the III-N material structure.

Figure 7:
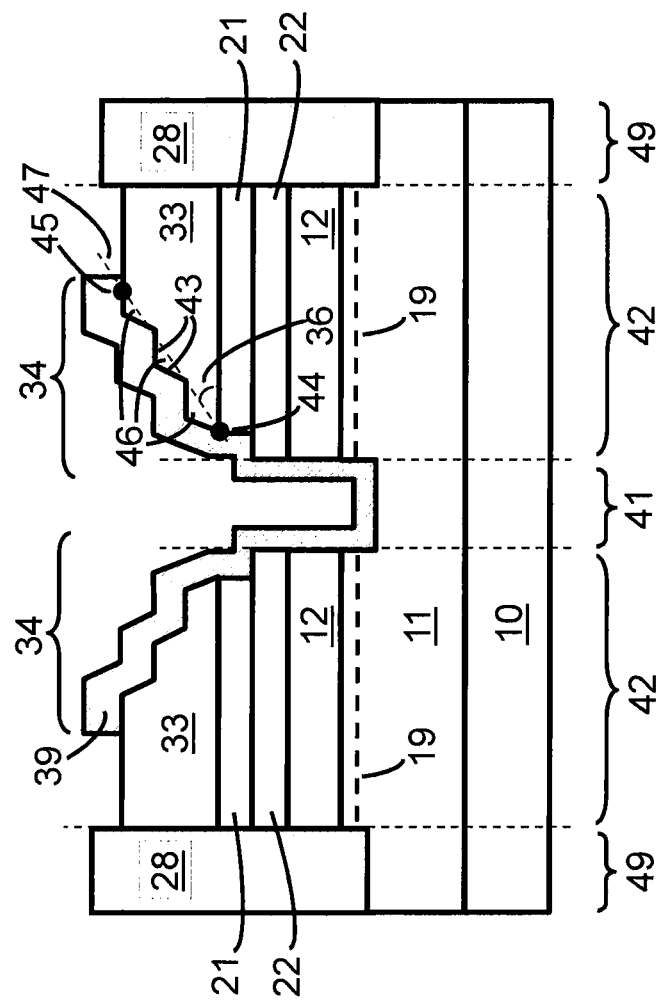
FIG. 7 is a cross-sectional view of another implementation of a III-N diode.

Another implementation is shown in FIG. 7. The diode in FIG. 7 is similar to that of FIG. 5, but the recess in the electrode-defining layer 33 further extends into the III-N materials. As shown, the recess can extend at least through the 2DEG 19, such that the anode contact 39 is in direct contact with the first III-N layer 11 at the bottom of the recess. Furthermore, it has been found that the depth of the recess containing anode contact 39 in FIG. 7 (that is, its depth below the 2DEG 19) can control or vary shifts in the forward operating voltage $V_{on}$, and correspondingly the reverse bias current $I_{reverse}$, of the device. Changing the depth of the aperture modifies the electric field profile in the III-N materials near the portion of 2DEG 19 modulated by the voltage on the anode contact 39. A deeper recess reduces the peak electric field in the region near 2DEG 19 in much the same way as a conventional field plate, thereby leading to devices with higher forward operating voltages $V_{on}$, lower reverse bias currents $I_{reverse}$, and/or higher reverse breakdown voltages.

Figure 8:
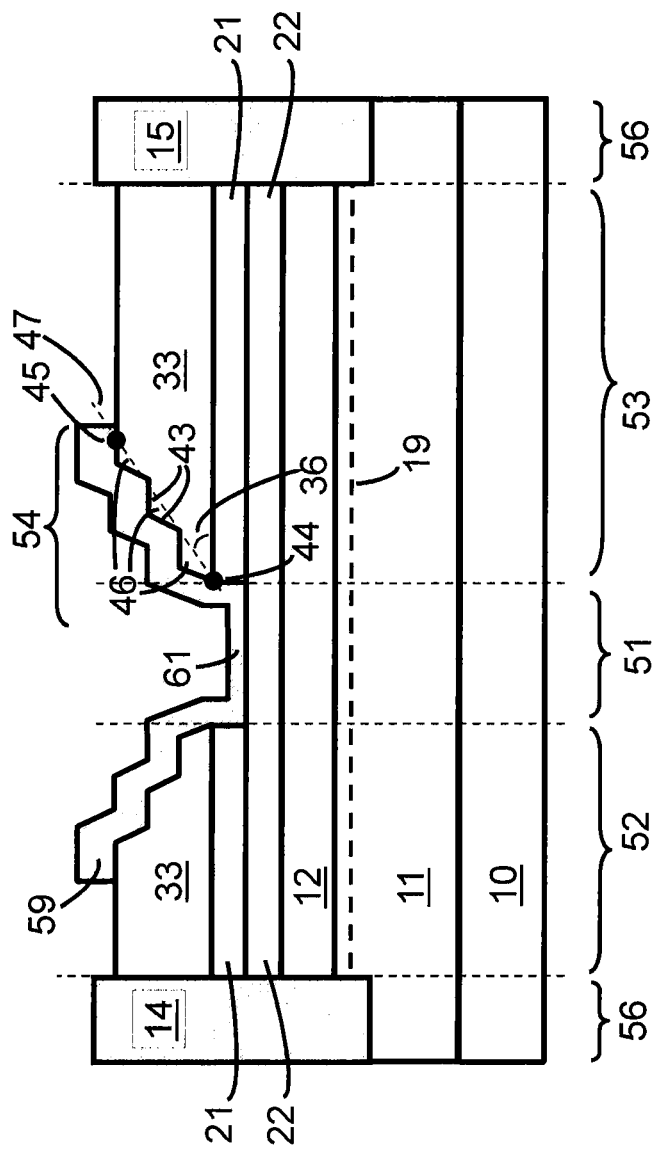
FIG. 8 is a cross-sectional view of one implementation of a III-N HEMT device.

A III-N HEMT transistor which makes use of the stepped field plate structure of the diodes shown in FIGS. 5 and 7 to allow for high voltage operation as well as simplified and reproducible manufacturing procedures is shown in FIG. 8. As with the diodes of FIGS. 5 and 7, the III-N HEMT of FIG. 8 includes a substrate 10, a first III-N layer 11 on top of the substrate, and a second III-N layer 12 on top of the first III-N layer. III-N layers 11 and 12 have different compositions from one another, the compositions selected such that a two-dimensional electron gas (2DEG) 19 (illustrated by a dashed line), i.e., a conductive channel, is induced in the first III-N layer 11 near the interface between the first and second III-N layers 11 and 12, respectively. An electrode-defining layer 33 is formed over the second III-N layer, the electrode-defining layer 33 including a recess which extends through the entire thickness of the electrode-defining layer 33. The electrode-defining layer 33 is typically between about 0.1 microns and 5 microns thick, such as about 0.85 microns thick. The electrode-defining layer 33 can have a composition that is substantially uniform throughout. The electrode-defining layer 33 is formed of an insulator, such as $SiN_x$.

A gate 59 is formed in the recess. The gate 59 includes an active gate portion 61 in gate region 51 of the device, as well as an extending portion 54 which is over a portion of the electrode-defining layer in the drain access region 53, the extending portion 54 functioning as a field plate. The gate 59 is deposited conformally in the recess in the electrode-defining region with the extending portion over a sidewall 43 of the recess, the sidewall 43 extending from the portion of the electrode-defining layer 33 which is closest to region 51 (i.e., point 44) all the way to the point 45 at the top of the electrode-defining layer 33, just beyond where the electrode-defining layer 33 becomes substantially flat. Hence, the profile of the extending portion is at least partially determined by the profile of the sidewall 43. Source and drain contacts 14 and 15, respectively, are on opposite sides of the gate 59 and form ohmic contacts to the 2DEG channel 19. The device may also include additional III-N layers (not shown), for example a III-N buffer layer between the first III-N layer 11 and the substrate 10, or a III-N layer such as AlN between the first III-N layer 11 and the second III-N layer 12.

The III-N HEMT of FIG. 8 has a gate region 51, source and drain access regions 52 and 53, respectively, on opposite sides of the gate region, and ohmic regions 56. The source access region 52 is between the source contact 14 and portion 61 of the gate, and the drain access region 53 is between the drain contact 15 and portion 61 of the gate. As with the diodes of FIGS. 5 and 7, the III-N HEMT of FIG. 8 can also include a passivation layer 22 which contacts the III-N material surface at least in the access regions, and an additional dielectric layer 21 between the passivation layer 22 and the electrode-defining layer 33. However, as shown in FIG. 8, the recess in the electrode-defining layer 33 can extend through the entire thickness of the additional dielectric layer 21 but not through the passivation layer 22. Hence, passivation layer 22 can be between the III-N materials and portion 61 of the gate 59 in the gate region 51, thereby serving as a gate insulator. A gate insulator can help prevent gate leakage currents in the HEMT.

The III-N HEMT of FIG. 8 can be an enhancement-mode (i.e., normally off, with a threshold voltage greater than 0V)

or a depletion-mode (i.e., normally on, with a threshold voltage less than 0V) device. Other configurations for the III-N HEMT of FIG. 8 are also possible. For example, in one implementation, the recess in the electrode-defining layer 33 only extends partially through the thickness of the electrode-defining layer 33, such that a portion of the electrode-defining layer 33 is between the III-N materials and portion 61 of the gate (not shown). In this case, electrode-defining layer 33 can also function as a gate insulator, and it may be possible to omit the passivation layer 22 and/or the additional dielectric layer 21. In another implementation, the recess in the electrode-defining layer 33 additionally extends through the entire thickness of the passivation layer 22, and the gate 59 directly contacts the underlying III-N material (not shown). In yet another implementation, the recess further extends into the III-N materials (not shown), such as through the 2DEG 19, as with the diode of FIG. 7. In the case where the recess extends through the 2DEG 19, the HEMT can be an enhancement-mode device.

Figure 9:
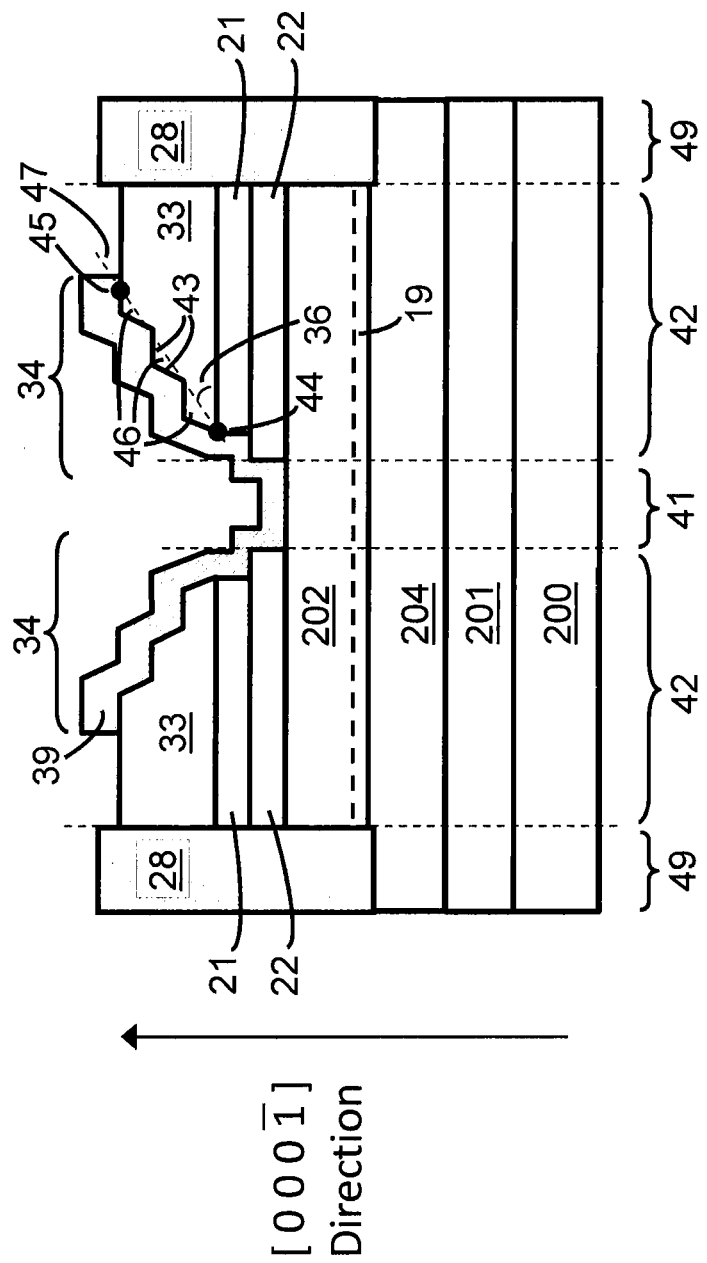
FIG. 9 is a cross-sectional view of another implementation of a III-N diode.
Figure 10:
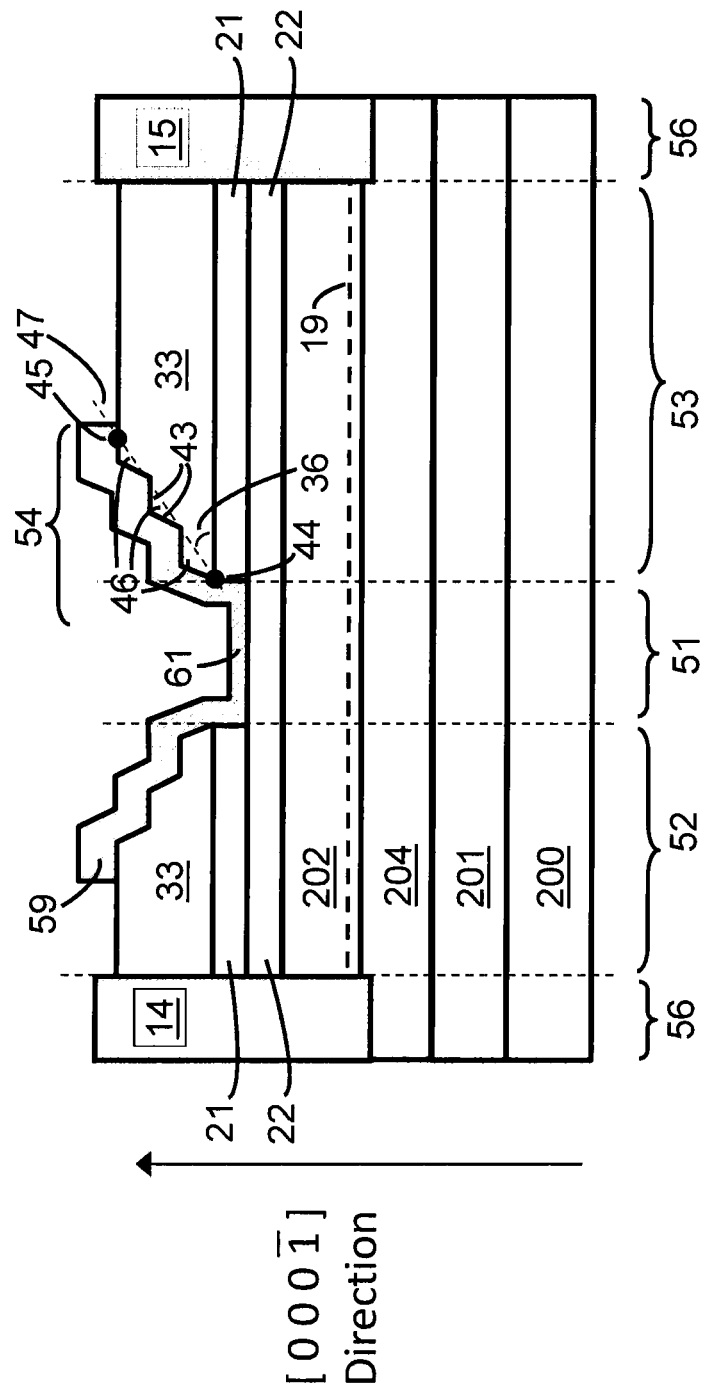
FIG. 10 is a cross-sectional view of another implementation of a III-N HEMT device.

More implementations of devices with stepped field plate structures are shown in FIGS. 9 and 10. FIG. 9 shows a cross-sectional view of a diode similar to the device in FIG. 5, but which is fabricated on III-N semiconductor material that is either oriented in the N-polar [0 0 0 1 bar] direction or is a nitrogen-terminated semipolar material. That is, the face of the III-N materials furthest from the substrate is either a [0 0 0 1 bar] face or is a nitrogen-terminated semipolar face. The device includes a substrate 200 which is suitable for growth of N-polar or semipolar III-N materials. Layer 201 is a buffer layer, such as GaN or AlN, which reduces the defect density in the overlying III-N material. In some cases, it is possible to omit layer 201 and grow III-N layer 204 directly on the substrate 200. The composition of III-N layers 204 and 202 are chosen such that a 2DEG 19 can be induced in layer 202 near the interface between layers 202 and 204. For example, layer 204 can be AlGaN or AlInGaN, and layer 202 can be GaN. An additional III-N layer (not shown), such as a layer of AlN, can be included between III-N layers 204 and 202. Electrode-defining layer 33 is similar to or the same as that used in the diode of FIG. 5. Anode contact 39, which is formed in the recess in the electrode-defining layer 33, contacts the surface of III-N layer 202 opposite the substrate 200. A single cathode contact 28 is formed which contacts the 2DEG 19 and is in close proximity to at least a portion of anode contact 39. The anode contact 39 is a Schottky contact, and the single cathode contact 28 is an ohmic contact. As in the diode of FIG. 5, a passivation layer 22, such as a layer of $SiN_x$, can be included on the uppermost surface of the III-N material structure, and an additional dielectric layer 21, such as a layer of AlN, can be included between the electrode-defining layer 33 and the passivation layer 22. Similarly to the diode of FIG. 7, the recess containing the anode contact 39 can also extend into the III-N material structure (not shown), for example extending through the 2DEG 19, and the anode contact 39 can contact III-N layer 204 at the bottom of the recess.

FIG. 10 shows a cross-sectional view of a III-N HEMT transistor similar to the device of FIG. 8, but which is fabricated on III-N semiconductor material that is either oriented in the N-polar [0 0 0 1 bar] direction or is a nitrogen-terminated semipolar material. The device includes a substrate 200 which is suitable for growth of N-polar or semipolar III-N materials. Layer 201 is a buffer layer, such as GaN or AlN, which reduces the defect density in the overlying III-N material. In some cases, it is possible to omit layer 201 and grow III-N layer 204 directly on the substrate 200. The composition of III-N layers 204 and 202 are chosen such that a 2DEG 19 can be induced in layer 202 near the interface between layers 202 and 204. For example, layer 204 can be AlGaN or AlInGaN, and layer 202 can be GaN. An additional III-N layer (not shown), such as a layer of AlN, can be included between III-N layers 204 and 202. Electrode-defining layer 33, which again includes a recess, is similar to or the same as that of FIG. 8. A gate 59 is formed in the recess. The gate 59 includes an active gate portion 61 in gate region 51 of the device, as well as an extending portion 54 which is over a portion of the electrode-defining layer in the drain access region 53, the extending portion 54 functioning as a field plate. The gate 59 is deposited conformally in the recess in the electrode-defining region with the extending portion over a sidewall 43 of the recess, the sidewall 43 extending from the portion of the electrode-defining layer 33 which is closest to region 51 (i.e., point 44) all the way to the point 45 at the top of the electrode-defining layer 33, just beyond where the electrode-defining layer 33 becomes substantially flat. Hence, the profile of the extending portion is at least partially determined by the profile of the sidewall 43. Source and drain contacts 14 and 15, respectively, are on opposite sides of the gate 59 and form ohmic contacts to the 2DEG channel 19.

As in the HEMT of FIG. 8, a passivation layer 22, such as a layer of $SiN_x$, can be included on the uppermost surface of the III-N material structure, and an additional dielectric layer 21, such as a layer of AlN, can be included between the electrode-defining layer 33 and the passivation layer 22. As shown in FIG. 10, the recess in the electrode-defining layer 33 can extend through the entire thickness of the additional dielectric layer 21 but not through the passivation layer 22, such that passivation layer 22 also serves as a gate insulator.

The III-N HEMT of FIG. 10 can be an enhancement-mode (i.e., normally off, with a threshold voltage greater than 0V) or a depletion-mode (i.e., normally on, with a threshold voltage less than 0V) device. Other configurations for the III-N HEMT of FIG. 10 are also possible. For example, in one implementation, the recess in the electrode-defining layer 33 only extends partially through the thickness of the electrode-defining layer 33, such that a portion of the electrode-defining layer 33 is between the III-N materials and portion 61 of the gate (not shown). In this case, electrode-defining layer 33 can also function as a gate insulator, and it may be possible to omit the passivation layer 22 and/or the additional dielectric layer 21. In another implementation, the recess in the electrode-defining layer 33 additionally extends through the entire thickness of the passivation layer 22, and the gate 59 directly contacts the underlying III-N material (not shown). In yet another implementation, the recess further extends into the III-N materials (not shown), such as through the 2DEG 19, as in the diode of FIG. 7.

Figure 11:
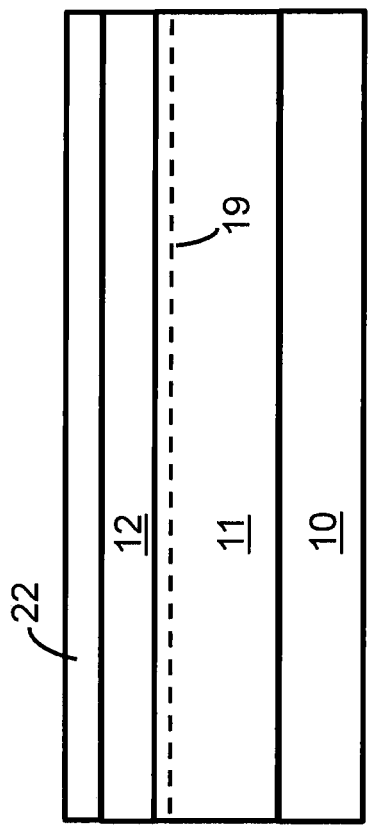
Figure 12:
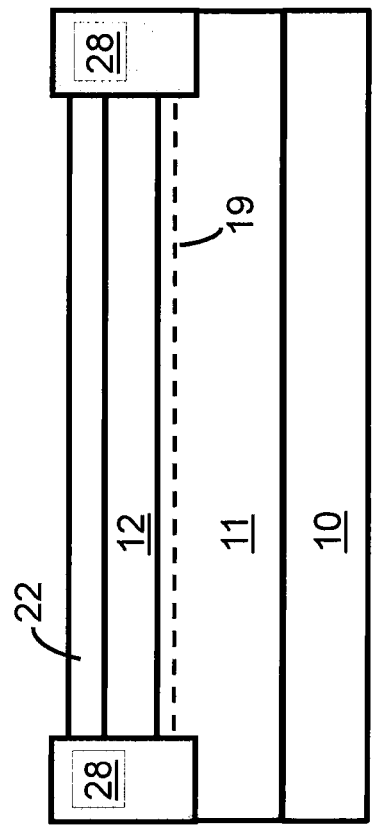

A method of forming the device of FIG. 5 is illustrated in FIGS. 11-20. Referring to FIG. 11, III-N material layers 11 and 12 are formed on substrate 10, for example by metalorganic chemical vapor deposition (MOCVD) or molecular beam epitaxy (MBE). Passivation layer 22, formed over the III-N material layers 11 and 12, is then deposited by methods such as MOCVD or plasma enhanced chemical vapor deposition (PECVD). Next, as seen in FIG. 12, a cathode contact 28 is formed which contacts the 2DEG 19 induced in the III-N material layers. Cathode contact 28 can be formed in a number of ways. For example, a metal or combination of metals can be deposited, for example by evaporation, sputtering, or CVD, in ohmic contact region 49 upon the surface of layer 12, followed by a thermal anneal which results in the deposited metal forming a metallic alloy with the underlying semiconductor material. Alternatively, n-type dopants can be ion implanted into ohmic region 49, followed by a metal deposition by evaporation, sputtering, or CVD, atop this region. Or the material in ohmic contact region 49 can be etched away, n-type material can be regrown in this region by MOCVD or MBE, and metal can then be deposited atop this region.

Figure 13:
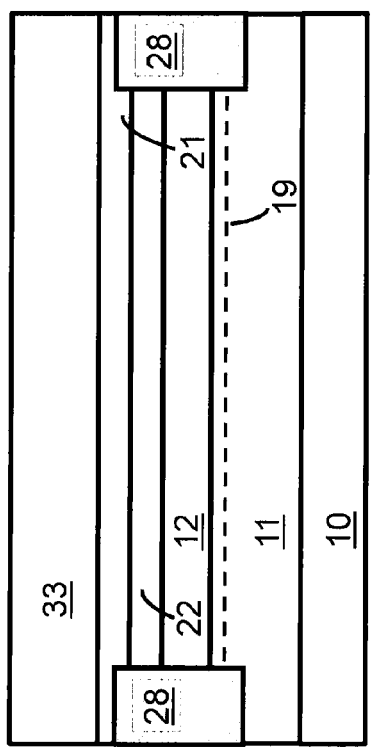

As seen in FIG. 13, the additional dielectric layer 21 and electrode-defining layer 33 are then deposited over passivation layer 22, for example by PECVD, sputtering, or evaporation. A recess is then etched through the electrode-defining layer, for example by reactive ion etching RIE or inductively coupled plasma (ICP) etching. The procedure for forming the recess is illustrated in FIGS. 14-19.

Figure 14:
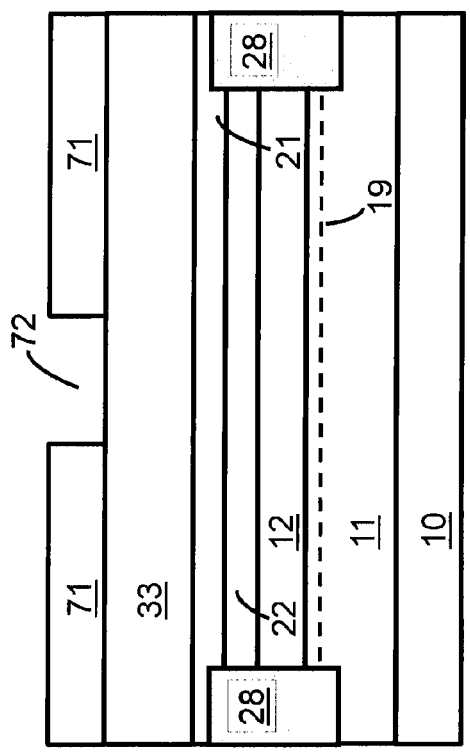
Figure 15:
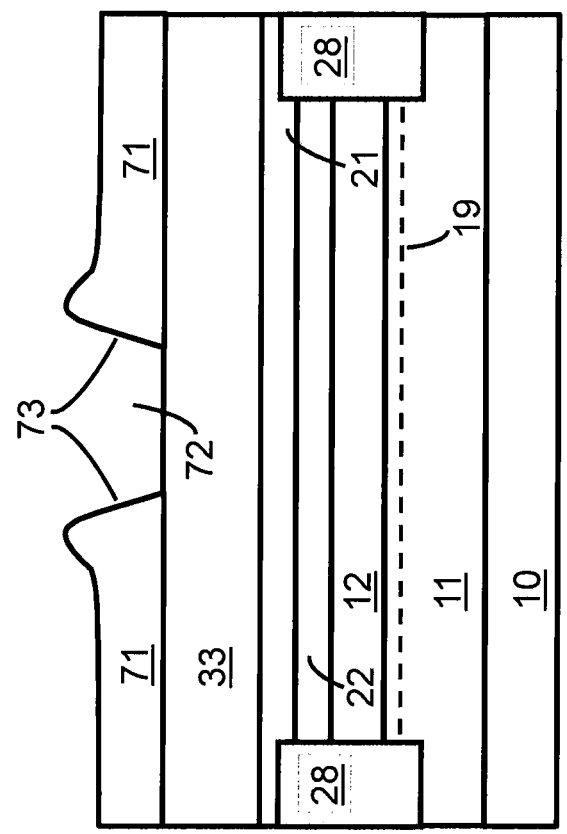

Referring to FIG. 14, a photoresist masking layer 71 is patterned on the electrode-defining 33 to have an opening 72. Patterning can be performed by standard lithography procedures. The photoresist in the masking layer 71 is then redistributed, for example by thermally annealing the structure, resulting in the photoresist profile shown in FIG. 15. The anneal is performed at a temperature that does not damage the photoresist layer 71 or any of the underlying layers. As illustrated in FIG. 15, following the redistribution of the photoresist, the photoresist masking layer has slanted sidewalls 73. The resulting profile of the photoresist layer 71 and the sidewalls 73 can be controlled by varying anneal conditions, such as anneal time, anneal temperature, and the chemistry of the ambient gas in which the anneal is performed. For example, a longer anneal time or a higher temperature may result in a smaller slope in the sidewalls 73.

Figure 16:
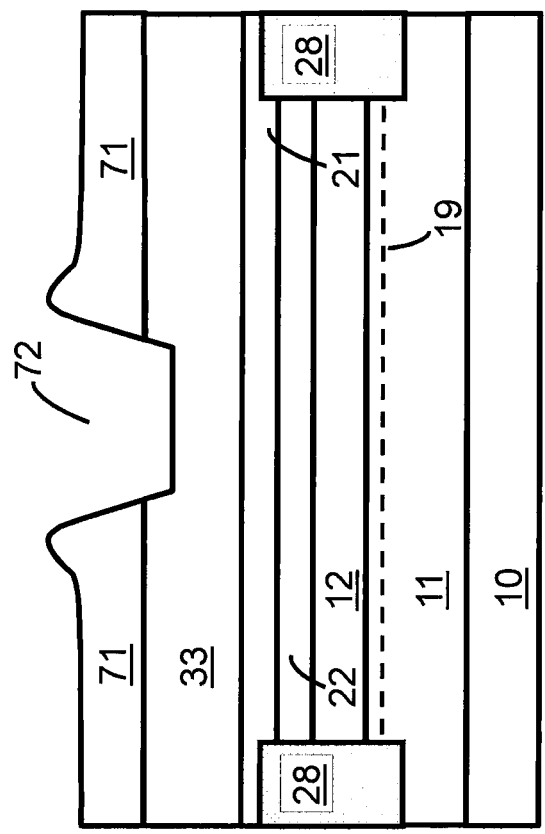

Referring to FIG. 16, the recess in the electrode-defining layer 33 is then partially formed by performing a first etch employing an etch chemistry that etches both the photoresist in layer 71 and the material of the electrode-defining layer 33. For example, if the electrode-defining layer 33 is $SiN_x$, the first etch can be performed by Reactive Ion Etching (RIE) or Inductively Coupled Plasma (ICP) etching using an etch chemistry that includes $O_2$ and $SF_6$. In some implementations, the first etch is a substantially anisotropic etch.

Figure 17:
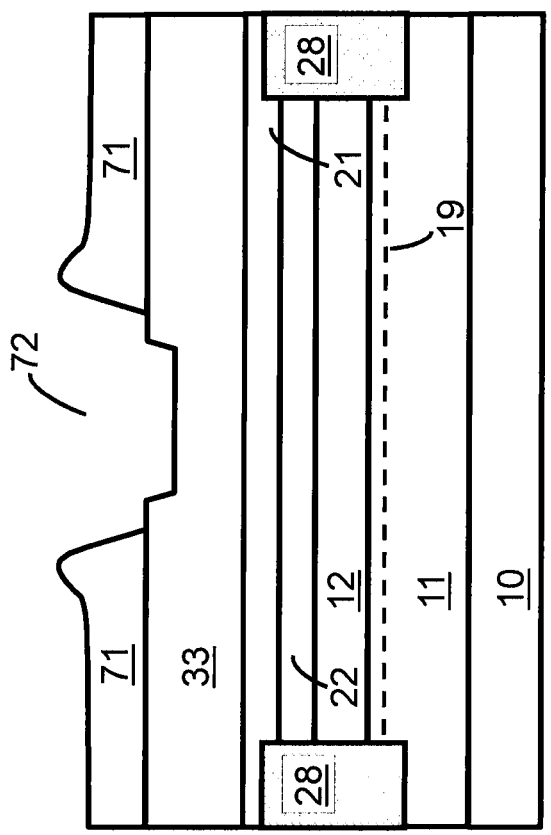
Figure 18:
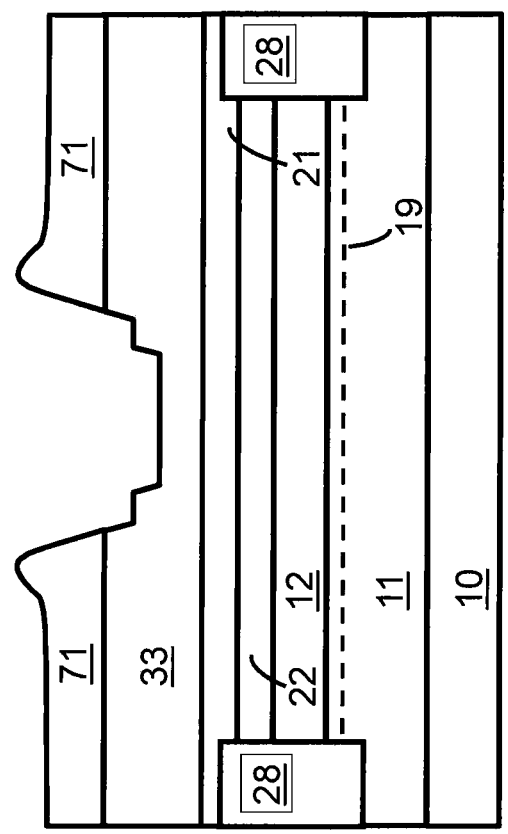

As illustrated in FIG. 17, a second etch is then performed which etches the photoresist masking layer 71 without substantially etching the electrode-defining layer 33, thereby increasing the width of the opening 72. For example, if the electrode-defining layer 33 is $SiN_x$, the second etch can be performed by Reactive Ion Etching (RIE) or Inductively Coupled Plasma (ICP) etching using an etch chemistry that includes only $O_2$. In some implementations, the second etch is a substantially isotropic etch. A third etch is then performed which, like the first etch, utilizes an etch chemistry that etches both the photoresist in layer 71 and the material of the electrode-defining layer 33, resulting in the profile of FIG. 18. The photoresist etch procedure, followed by the procedure for etching both layers 71 and 33, are then repeated multiple times, until the recess extends all the way through the electrode-defining layer 33, resulting in the aperture having a stepped sidewall. The photoresist masking layer 71 is then removed, for example by a solvent clean, resulting in the profile shown in FIG. 19. Additional dielectric layer 21 can be formed of a material that is not substantially etched by the etch procedure used to etch the recess in the electrode-defining layer 33.

Referring to FIG. 20, the portion of the additional dielectric layer 21 which is adjacent to the recess in electrode-defining layer 33 is then removed, for example by performing an etch which etches the material of the additional dielectric layer 21 but does not etch the material of electrode-defining layer 33 or passivation layer 22. For example, when layers 33 and 22 are both $SiN_x$, and layer 21 is AlN, the portion of layer 21 adjacent to the recess in electrode-defining layer 33 can be chemically etched in a base, such as a photoresist developer. Next, a portion of the passivation layer 22 adjacent to the recess is etched, for example by RIE or ICP etching, resulting in the structure of FIG. 20. Finally, electrode 39 is deposited conformally in the recess, for example by evaporation, sputtering, or CVD, and optionally the portion of layers 21 and 33 which are over the cathode contact 18 are removed, such as by chemical wet etching, or by RIE or ICP etching, resulting in the diode of FIG. 5.

The slanted angle of the sidewalls of each step structure in the recess through the electrode-defining layer 33 results from the slanted sidewall of the photoresist masking layer 71, as illustrated in FIG. 15. If a vertical sidewall is desired instead of a slanted sidewall for each step structure, then the photoresist redistribution procedure described above can be omitted, or altered to change the resulting photoresist profile.

The devices of FIGS. 7-10 can be formed using slightly modified versions of the methods described above. For example, the device of FIG. 7 can be formed using the procedures described above, with one additional step. Once the recess extends through the passivation layer 22 to the uppermost surface of the III-N materials, and prior to deposition of electrode 39, the structure can be etched using an etch chemistry that etches III-N materials at a higher etch rate than that of the materials used for electrode-defining layer 33 and passivation layer 22. For example, when electrode-defining layer 33 and passivation layer 22 are both $SiN_x$, a $Cl_2$ RIE or ICP etch can be performed, resulting in the recess extending into the III-N material structure. The device of FIG. 8 can be formed using the procedures described above, with the exceptions that source and drain ohmic contacts 14 and 15, respectively, are formed in place of the cathode contact 18, and the step of etching the passivation layer 22 is omitted. The procedures for forming the devices of FIGS. 9 and 10 are the same as the procedures for forming those of FIGS. 5 and 8, respectively, with the exception that the III-N layers formed on the substrate in FIGS. 9 and 10 have a different crystallographic orientation as compared to the III-N layers formed on the substrate in FIGS. 5 and 8.

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

What is claimed is:

1. A method of forming a III-N device, comprising:
    forming an electrode-defining layer having a thickness on a surface of a III-N material structure that has a 2DEG formed therein;
    patterning a masking layer over the electrode-defining layer, the masking layer including an opening having a width;
    performing an etching step, the etching step comprising etching the electrode-defining layer beneath the opening to form a recess therein, the recess having a sidewall which comprises a plurality of steps, a portion of the recess distal from the III-N material structure having a first width, and a portion of the recess proximal to the III-N material structure having a second width, the first width being larger than the second width;
    removing the masking layer; and
    forming an electrode in the recess, the electrode including an extending portion over the sidewall, a portion of the electrode-defining layer being between the extending portion and the III-N material structure; wherein the etching step includes a first procedure and a second procedure, the first procedure comprising removing a portion of the electrode-defining layer, and the second procedure comprising removing a portion of the masking layer without entirely removing the masking layer and without substantially etching the electrode-defining layer, the second procedure causing an increase in the width of the opening in the masking layer, wherein the masking layer comprises photoresist; wherein the method further comprises redistributing the photoresist in the masking layer prior to performing the etching step; and wherein redistributing the photoresist causes the masking layer to have slanted sidewalls adjacent to the opening.

2. The method of claim 1, wherein the first procedure is performed a second time after the second procedure has been performed.

3. The method of claim 2, wherein the second procedure is performed a second time after the first procedure has been performed a second time.

4. The method of claim 1, wherein redistributing the photoresist comprises thermally annealing the photoresist.

5. The method of claim 1, wherein the etching step results in the recess extending through the entire thickness of the electrode-defining layer.

6. The method of claim 5, wherein the etching step is a first etching step, the method further comprising performing a second etching step resulting in the recess further extending into the III-N material structure.

7. The method of claim 1, further comprising forming an additional dielectric layer having a thickness between the electrode-defining layer and the III-N material structure.

8. The method of claim 7, wherein the etching step results in the recess further extending through the entire thickness of the additional dielectric layer.

9. The method of claim 7, wherein the device further comprises a passivation layer having a thickness between the electrode-defining layer and the additional dielectric layer.

10. The method of claim 9, wherein the etching step results in the recess further extending through the entire thickness of the passivation layer.

11. The method of claim 1, wherein the electrode is an anode and the III-N device is a diode.

12. The method of claim 1, wherein the electrode is a gate, and the III-N device is a transistor.

13. The method of claim 1, wherein the etching step results in the sidewall forming an effective angle of about 40 degrees or less relative to the surface of the III-N material structure.

14. The method of claim 1, wherein the etching step results in at least one of the steps in the sidewall having a first surface that is substantially parallel to the surface of the III-N material structure and a second surface that is slanted, the second surface forming an angle of between 5 and 85 degrees with the surface of the III-N material structure.

15. A method of forming a semiconductor device, comprising:
    forming an electrode-defining layer having a thickness on a surface of a III-N semiconductor material structure that has a 2DEG formed therein;
    patterning a photoresist layer over the electrode-defining layer, the photoresist layer including an opening having a width;
    performing a first etch, the first etch comprising etching the electrode-defining layer beneath the opening to form a recess therein, the recess having a sidewall;
    after etching the electrode-defining layer, performing a second etch which removes a portion of the masking layer without entirely removing the masking layer, the second etch increasing the width of the opening in the masking layer;
    after performing the second etch, performing a third etch which etches more of the electrode-defining layer beneath the opening and extends the recess;
    removing the photoresist layer; and
    forming an electrode in the recess,
    wherein the method further comprises redistributing the photoresist in the photoresist layer prior to performing the first etch; wherein redistributing the photoresist causes the masking layer to have slanted sidewalls adjacent to the opening.

16. The method of claim 15, wherein redistributing the photoresist comprises thermally annealing the photoresist.

17. The method of claim 15, wherein the first etch or the third etch results in the sidewall of the recess being a slanted sidewall.

18. The method of claim 15, wherein the second etch is a substantially isotropic etch.

19. The method of claim 15, wherein the second etch removes the portion of the masking layer without substantially etching the electrode-defining layer.

* * * * *